(12) United States Patent
Zandi et al.

(10) Patent No.: US 11,691,175 B1
(45) Date of Patent: Jul. 4, 2023

(54) METHODS FOR AREA-SELECTIVE DEPOSITION OF POLYMER FILMS USING SEQUENTIALLY PULSED INITIATED CHEMICAL VAPOR DEPOSITION (SPICVD)

(71) Applicant: Tokyo Electron Limited, Tokyo (JP)

(72) Inventors: Omid Zandi, Austin, TX (US);
Jacques Faguet, Austin, TX (US);
Ornella Sathoud, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/866,897

(22) Filed: Jul. 18, 2022

(51) Int. Cl.
B32B 38/04 (2006.01)
B05D 1/00 (2006.01)
B05D 5/12 (2006.01)

(52) U.S. Cl.
CPC .............. B05D 1/60 (2013.01); B05D 5/12 (2013.01); B05D 2202/00 (2013.01)

(58) Field of Classification Search
CPC ......... B05D 1/60; B05D 5/12; B05D 2202/00
See application file for complete search history.

(56) References Cited

U.S. PATENT DOCUMENTS

| | | | |
|---|---|---|---|
| 8,986,488 B2 | 3/2015 | Hattori et al. | |
| 10,115,586 B2 | 10/2018 | Faguet et al. | |
| 10,319,637 B2 | 6/2019 | Mohanty et al. | |
| 2003/0205823 A1 | 11/2003 | Leu et al. | |
| 2004/0163758 A1 | 8/2004 | Kagan et al. | |
| 2012/0052681 A1* | 3/2012 | Marsh ................. C23C 16/0227 | 438/763 |
| 2018/0233350 A1 | 8/2018 | Tois et al. | |
| 2019/0164758 A1* | 5/2019 | Su ..................... H01L 21/32051 | |

FOREIGN PATENT DOCUMENTS

| | | |
|---|---|---|
| JP | 2016047941 | 4/2016 |
| WO | 2006112408 | 10/2006 |

OTHER PUBLICATIONS

Dinninger, "TSMC's Chiplets Integration", SemiWiki.com, Jan. 2022, 7 pgs.

(Continued)

*Primary Examiner* — Nathan T Leong
(74) *Attorney, Agent, or Firm* — Egan, Enders & Huston LLP.

(57) ABSTRACT

The present disclosure provides embodiments of improved area-selective deposition (ASD) processes and methods for selectively depositing polymer films on a variety of different target material. More specifically, the present disclosure provides improved ASD processes and related methods that use a cyclic vapor deposition process, which sequentially exposes a surface of a substrate to a polymer precursor followed by an initiator to selectively deposit a polymer thin film on a target material exposed on the substrate surface. The process of sequentially exposing the substrate surface to the precursor and the initiator can be repeated for one or more cycles of the cyclic vapor deposition process until a predetermined thickness of the polymer thin film is selectively deposited on the target material. In one embodiment, sequentially pulsed initiated chemical vapor deposition (spiCVD) is used to selectively deposit the polymer thin film on the target material.

23 Claims, 14 Drawing Sheets

(56) References Cited

OTHER PUBLICATIONS

Ichiki et al., "Feasiblity Study Into The Deposition of an Organic Planarization Layer Using Sequential Polymerization Initiated Chemical Vapor Depsition", Portal Komunikacji Naukowej, 2 pgs.
Bakker et al., "Initiated Chemical Vapour Deposition (iCVD) of Thermally Stable Poly-Glycidyl Methacrylate", Surface And Coatings Technology, vol. 201, Issues 22-23, Sep. 2007, 7 pgs.
Yoshida et al., "Conformal Coating of Ploy-glycidyl Methacrylate as Lithographic Polymer via Initiated Chemical Vapor Deposition". Journal of Micro/Nanolithography, MEMS, and MOEMS, May 2022, 8 pgs.

* cited by examiner

METHODS FOR AREA-SELECTIVE DEPOSITION OF POLYMER FILMS USING SEQUENTIALLY PULSED INITIATED CHEMICAL VAPOR DEPOSITION (SPICVD)

BACKGROUND

The present disclosure relates to the processing of substrates. In particular, it provides improved processes and methods for forming polymer thin films used in integrated circuit (IC) processing.

As geometries in substrate processing continue to shrink, the technical challenges to forming structures on substrates increase. Lithography techniques are particularly challenging for shrinking geometries. One traditional substrate lithography method utilizes a photolithography process which includes photoresist coating, exposure, and photoresist develop steps. The materials and processes utilized in these steps may all impact critical dimension targeting, line roughness, and uniformity on a substrate.

With continued shrinkage of integrated circuit (IC) device feature size down to angstrom-level, conventional lithography will hit its resolution limit or will become too costly to use at scale. One strategy is to relax the dependence on lithography using chemically-directed, self-aligned, selective, bottom-up patterning. At the core of this strategy is area-selective processing (ASP), which is centered on the idea of exploiting the surface chemistry of exposed material layers to drive selective processing of such layers. Area-selective processing techniques can be used to selectively deposit and/or remove material from desired areas of a patterned substrate, thereby avoiding the use of photolithography for patterning.

Area selective deposition (ASD) is one example of a bottom-up, area-selective process that provides uniform deposition of material in only desired areas of a patterned substrate. Unlike conventional deposition techniques, which are designed to achieve uniform deposition over large areas, ASD enables materials to be selectively deposited on target areas (or "growth surfaces"), while avoiding deposition on nontarget areas (or "nongrowth surfaces"). ASD can be used to selectively deposit a wide variety of materials on target materials. For example, ASD techniques can be used to selectively deposit dielectric-on-dielectric (DoD), dielectric-on-metal (DoM), metal-on-dielectric (MoD) and metal-on-metal (MoM).

Area selective deposition can be achieved using a wide variety of deposition techniques, such as chemical vapor deposition (CVD), atomic layer deposition (ALD) and molecular layer deposition (MLD), which often utilize surface modifications and vapor phase deposition to deposit material on a target area. Surface modifications are typically aimed at promoting the adsorption of precursor molecules on growth surfaces and/or suppressing the adsorption of precursor molecules on nongrowth surfaces. For example, currently available DoD techniques often use a molecular inhibitor, such as a self-assembled monolayer (SAM), to inhibit deposition of a dielectric material on nongrowth surfaces such as, e.g., a metal or metal oxide surface.

Self-assembled monolayers (SAMs) are organic molecules that form ordered surface monolayer coatings on materials that modify the chemical and physical properties of the material's surface. Some SAM-forming molecules (such as those with thiol or carboxylic acid head-groups) assemble selectively on metal versus dielectric materials. For this reason, SAMs have been used in a variety of DoD applications to inhibit dielectric growth on metal surfaces. For example, SAMs have been used to passivate the metal (e.g., copper) lines when fabricating fully self-aligned vias (FSAVs) in the back end of the line (BEOL). The passivation provided by the SAM allows for selective dielectric growth on interlayer dielectric (ILD) patterns by inhibiting dielectric growth on the passivated metal lines.

FIGS. 1A-1B (Prior Art) illustrate a conventional DoD process that utilizes a SAM to inhibit dielectric growth on a metal surface. As shown in FIG. 1A, substrate 100 includes a metal feature 105 (e.g., a metal line) formed within a dielectric pattern 110. A SAM 115 is formed on the metal feature 105 in FIG. 1A to inhibit dielectric growth on the exposed surface of the metal feature 105 when a deposition process is subsequently performed in FIG. 1B to selectively deposit a dielectric material 120 on the dielectric pattern 110.

Unfortunately, self-assembled monolayers (such as the SAM 115 shown in FIGS. 1A-1B) suffer from low thermal, mechanical, and shelf-life stability, rendering them less effective for selective DoD applications. For example, SAM-forming molecules tend to rearrange, desorb, or even migrate to the neighboring dielectric pattern, sometimes even pulling metal impurities with them, during processing or over prolonged storage (see, FIG. 1B). These events compromise the SAM's ability to effectively enable selective DoD without reliability concerns. Additionally, defects in the SAM 115 may lead to incomplete blanket coverage of the metal feature 105. This incomplete coverage may allow dielectric material 120 to grow on the metal feature 105, thereby producing additional reliability concerns. Finally, since a SAM is only a few nm thick, and flexible in nature, it is not ideal for directing the vertical growth of dielectric patterns. This leads to mushrooming of the dielectric material 210 over the metal feature 105, as shown in FIG. 1B, thus compromising the critical dimensions of the pattern.

Like SAMs, polymers can be used to either inhibit or promote growth on one surface vs another. In some cases, polymer thin films (e.g., polymer films having a thickness<20 nm) can be used as sacrificial layers to drive selectivity during IC fabrication. Similar to SAMs, selective deposition of polymer thin films can allow for bottom-up patterning using polymer sacrificial layers on target areas. The polymer sacrificial layers offer flexibility when it comes to chemical and physical properties, and ease of removal.

A wide variety of deposition techniques, such as spin-on coating, immersion coating, CVD, ALD and MLD, have been used to deposit polymer thin films in both selective and non-selective processes. In some cases, ASD techniques have been used to selectively deposit polymer-on-dielectric (PoD) and polymer-on-metal (PoM) via passivated metal or metal oxide (using a SAM) using a variety of deposition processes, such as CVD, ALD and MLD. However, deposition processes currently used to deposit polymer thin films on dielectric and on metal provide limited control over selectivity and deposited polymer film thickness.

A need, therefore, exists for improved ASD processes and methods for selective deposition of polymer thin films on a variety of material surfaces.

SUMMARY

This present disclosure provides various embodiments of improved area-selective deposition (ASD) processes and methods for selectively depositing polymer films on a variety of different target materials. More specifically, the present disclosure provides improved ASD processes and related methods that use a cyclic vapor deposition process, which sequentially exposes a surface of a substrate to a precursor followed by an initiator to selectively deposit a polymer thin film on a target material exposed on the substrate surface. The process of sequentially exposing the substrate surface to the precursor and the initiator can be repeated for one or more cycles of the cyclic vapor deposition process described herein until a desired amount (or a predetermined thickness) of the polymer thin film is selectively deposited on the target material. In at least one preferred embodiment, the improved ASD processes and methods described herein may use sequentially pulsed initiated chemical vapor deposition (spiCVD) to selectively deposit the polymer thin film on the target material.

The present disclosure also provides various embodiments of improved processes and methods for stabilizing self-assembled monolayers (SAMs). In the present disclosure, a cyclic vapor deposition process is used to selectively deposit a polymer thin film on a SAM structure formed on a target material. The polymer thin film selectively deposited on the SAM structure stabilizes the SAM structure by: (a) healing defects in the SAM structure and providing blanket coverage over the target material surface, (b) preventing migration of SAM-forming molecules to neighboring non-target surfaces, and (c) increasing the thickness and rigidity of the SAM structure. In at least one preferred embodiment, the improved processes and methods for stabilizing a SAM structure may use spiCVD to selectively deposit the polymer thin film on the SAM structure.

In a first embodiment, a method for area-selective deposition (ASD) of polymer films is provided. The method may comprise providing a substrate having a target material and a non-target material exposed on a surface of the substrate. The method further comprises exposing the surface of the substrate to a vapor-phase precursor, which chemically reacts with and bonds to a surface of the target material to selectively form a condensate layer on the surface of the target material, while avoiding condensate formation on the non-target material. The method also comprises subsequently exposing the surface of the substrate to a vapor-phase initiator after the condensate layer is selectively formed on the surface of the target material, wherein the vapor-phase initiator reacts with and polymerizes the condensate layer to selectively deposit a polymer film on the surface of the target material.

In alternatives of the first embodiment, the surface of the substrate is initially exposed to the vapor-phase precursor for a precursor exposure time before the surface of the substrate is subsequently exposed to the vapor-phase initiator. The method may further comprise controlling a thickness of the polymer film by varying at least one of the precursor exposure time and a vapor pressure of the vapor-phase precursor. The method may also further comprise repeating said exposing the surface of the substrate to the vapor-phase precursor and said subsequently exposing the surface of the substrate to the vapor-phase initiator for a predetermined number of cycles to selectively deposit a predetermined thickness of the polymer film on the surface of the target material without contaminating the non-target material with polymer. In addition, the method may also comprise controlling an amount of the polymer film that is selectively deposited on the target material, per cycle, by varying at least one of the precursor exposure time and a vapor pressure of the vapor-phase precursor. In one alternative, prior to exposing the surface of the substrate to the vapor-phase precursor, the method further comprises determining a selectivity window based on polymer growth rates achieved per cycle on the target material and on the non-target material; and selecting, from within the selectivity window, the predetermined number of cycles needed to selectively deposit the predetermined thickness of the polymer film on the surface of the target material without contaminating the non-target material with polymer.

In another alternative of the first embodiment, the target material is a dielectric material, and wherein the non-target material is a metal or metal oxide material. In another alternative, said exposing the surface of the substrate to the vapor-phase precursor comprises exposing the surface of the substrate to a monomer precursor, which chemically reacts with and bonds to a surface of the dielectric material to selectively form a monomer condensate layer on the surface of the dielectric material, while avoiding condensate formation on the metal or metal oxide material, and wherein said subsequently exposing the surface of the substrate to the vapor-phase initiator polymerizes the monomer condensate layer to selectively deposit the polymer film on the surface of the dielectric material. In still another alternative, said exposing the surface of the substrate to the vapor-phase precursor comprises exposing the surface of the substrate to a dielectric precursor, which chemically reacts with and bonds to a surface of the dielectric material to selectively form a condensate layer on the surface of the dielectric material, while avoiding condensate formation on the metal or metal oxide material, and wherein said subsequently exposing the surface of the substrate to the vapor-phase initiator polymerizes the condensate layer to selectively deposit a dielectric film on the surface of the dielectric material.

In yet another alternative of the first embodiment, the target material is a metal or metal oxide material, and wherein the non-target material is a dielectric material. In another alternative, prior to exposing the surface of the substrate to the vapor-phase precursor, the method further comprises forming a self-assembled monolayer (SAM) on a surface of the metal or metal oxide material to form a SAM-passivated metal or metal oxide. In still another alternative, said exposing the surface of the substrate to the vapor-phase precursor comprises exposing the surface of the substrate to a monomer precursor, which selectively condenses on the SAM to form a monomer condensate layer on the SAM-passivated metal or metal oxide, while avoiding condensate formation on the dielectric material, and wherein said subsequently exposing the surface of the substrate to the vapor-phase initiator polymerizes the monomer condensate layer to selectively deposit the polymer film on the SAM-passivated metal or metal oxide.

In a second embodiment, a method for area-selective deposition (ASD) of polymer films is provided. The method may comprise providing a substrate having a target material and a non-target material exposed on a surface of the substrate. The method further comprises sequentially exposing the surface of the substrate to a vapor-phase precursor and a vapor-phase initiator, such that the surface of the substrate is initially exposed to the vapor-phase precursor for a precursor exposure time before the surface of the substrate is subsequently exposed to the vapor-phase initiator, wherein the vapor-phase precursor chemically reacts with and bonds to a surface of the target material to selectively form a condensate layer on the surface of the target material, while avoiding condensate formation on the non-target material, and wherein the vapor-phase initiator reacts with and polymerizes the condensate layer to selectively deposit a polymer film on the surface of the target material. The method also comprises repeating said sequentially exposing the surface of the substrate to the vapor-phase precursor and the vapor-phase initiator for a predetermined number of cycles to selectively deposit a predetermined thickness of the polymer film on the surface of the target material without contaminating the non-target material with polymer.

In an alternative of the second embodiment, the method further comprises controlling an amount of the polymer film that is selectively deposited on the target material, per cycle, by varying at least one of the precursor exposure time and a vapor pressure of the vapor-phase precursor. In one alternative, the amount of the polymer film selectively deposited on the target material per cycle is less than 2 nm. In another alternative, prior to exposing the surface of the substrate to the vapor-phase precursor, the method further comprises determining a selectivity window based on polymer growth rates achieved per cycle on the target material and on the non-target material; and selecting, from within the selectivity window, the predetermined number of cycles needed to selectively deposit the predetermined thickness of the polymer film on the surface of the target material without contaminating the non-target material with polymer.

In still another alternative, the target material is a dielectric material, and wherein the non-target material is a metal or metal oxide material. In another alternative, said sequentially exposing the surface of the substrate to the vapor-phase precursor and the vapor-phase initiator comprises initially exposing the surface of the substrate to a monomer precursor, which chemically reacts with and bonds to a surface of the dielectric material to selectively form a monomer condensate layer on the surface of the dielectric material, while avoiding condensate formation on the metal or metal oxide material; and subsequently exposing the surface of the substrate to the vapor-phase initiator to polymerize the monomer condensate layer and selectively deposit the polymer film on the surface of the dielectric material. In yet another alternative, said sequentially exposing the surface of the substrate to the vapor-phase precursor and the vapor-phase initiator comprises initially exposing the surface of the substrate to a dielectric precursor, which chemically reacts with and bonds to a surface of the dielectric material to selectively form a condensate layer on the surface of the dielectric material, while avoiding condensate formation on the metal or metal oxide material; and subsequently exposing the surface of the substrate to the vapor-phase initiator to polymerize the condensate layer and selectively deposit a dielectric film on the surface of the dielectric material. In one alternative, the dielectric material is a low-k dielectric and in another alternative the dielectric material is a low-k dielectric deposited by spiCVD.

In another alternative of the second embodiment, the target material is a metal or metal oxide material, and wherein the non-target material is a dielectric material. In another alternative, prior to sequentially exposing the surface of the substrate to the vapor-phase precursor and the vapor-phase initiator, the method further comprises forming a self-assembled monolayer (SAM) assembly on a surface of the metal or metal oxide material to modify chemical and/or physical surface properties of the metal or metal oxide material and form a SAM-passivated metal or metal oxide. In a variation of this alternative, said sequentially exposing the surface of the substrate to the vapor-phase precursor and the vapor-phase initiator comprises initially exposing the surface of the substrate to a monomer precursor, which selectively condenses on the SAM assembly to form a monomer condensate layer on the SAM-passivated metal or metal oxide, while avoiding condensate formation on the dielectric material; and subsequently exposing the surface of the substrate to the vapor-phase initiator to polymerize the monomer condensate layer and selectively deposit the polymer film on the SAM-passivated metal or metal oxide.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
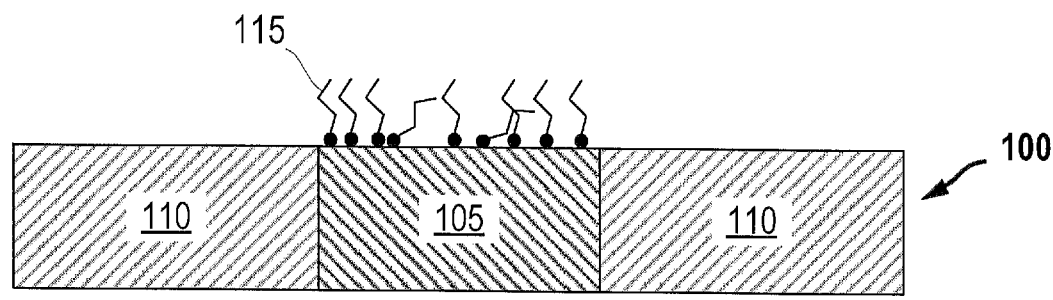
FIGS. 1A-1B (Prior Art) illustrate a conventional dielectric-on-dielectric (DoD) process that utilizes a self-assembled monolayer (SAM) to inhibit dielectric growth on a metal surface.

This present disclosure provides various embodiments of area-selective deposition (ASD) processes and methods for selectively depositing polymer films on a variety of different target materials. More specifically, the present disclosure provides improved ASD processes and related methods that selectively deposit polymer thin films on target materials using a cyclic vapor deposition process, which sequentially exposes a surface of a substrate to a precursor (e.g., a monomer or dielectric precursor) followed by an initiator to deposit a controlled amount of polymer on a target material exposed on the substrate surface. The process of sequentially exposing the substrate surface to the precursor and the initiator can be repeated for one or more cycles of the cyclic vapor deposition process described herein until a desired amount (or predetermined thickness) of the polymer is deposited on the target material.

SAM stabilization is one way to make a SAM a reliable strategy for ASD and DoD more specifically. In one approach, the SAM is not replaced but rather the SAM is reinforced with polymer films. In other approaches, thin film polymers alone may be used for ASD (though not necessarily for DoD).

In at least one preferred embodiment, a sequentially pulsed initiated chemical vapor deposition (spiCVD) process may be used to selectively deposit a polymer thin film on a target material. spiCVD is a vapor-phase polymer deposition technique that allows for controlled deposition of polymer thin films at low temperatures. As described in more detail below, spiCVD is a cyclic vapor deposition process that relies on the sequential introduction of a precursor and an initiator to the surface of a substrate. The surface of the substrate is initially exposed to the precursor to form a thin condensate layer on only target areas of the substrate. When the initiator is subsequently introduced, the initiator activates the precursor and causes polymerization of the precursor condensate layer to form an ultrathin polymer film on the target areas of the substrate. The ultrathin polymer film deposited in the first spiCVD cycle may be less than 2 nm, and in some embodiments, may be less than 1nm. In some embodiments, the spiCVD process may be repeated for one or more cycles to form additional ultrathin polymer film layers until a predetermined thickness (e.g., less than 20 nm) of the polymer film is selectively deposited on the target areas of the substrate.

Utilizing a spiCVD process to selectively deposit polymer thin films on a target material provides numerous advantages over other deposition techniques. For example, the sequential nature of the spiCVD process described herein allows for controlled coating of ultrathin amounts (e.g., 1-2 nm or less) of polymer on a target material. In some embodiments, the amount of polymer selectively deposited on the target material, per spiCVD cycle, can be controlled by varying the precursor exposure time, precursor vapor pressure, temperature and/or surface properties of the target material. In this manner, spiCVD can be used to fine tune the amount of polymer deposited on the target material, sometimes providing angstrom (A) level control of the deposition process. The cyclic nature of the spiCVD process allows for a more uniform deposition of the polymer film on the target material, while the precursor drives the selectivity of the deposition by enabling area-selective deposition in patterns of material with different wetting properties.

By using spiCVD, the ASD processes described herein may be used to selectively deposit polymer thin films on a wide variety of target materials, including dielectric materials, metal and metal oxide materials, and metal/metal oxides passivated with self-assembled monolayers (SAMs). The precursor selected for the deposition process is a driver of selectivity. The substrate surface chemistry is also a driver of selectivity. As described in more detail below, a wide variety of precursors may be used to deposit polymer thin films on different target materials by selecting a precursor with high chemical affinity for the target material and low chemical affinity for non-target material(s) residing on the same substrate. This allows the precursor selected for the deposition process to selectively condensate on the target material, while avoiding condensate formation on the non-target material(s). The selective condensation of the precursor, which may be driven by de-wetting and/or chemical/physical forces on the surface of the target material, allows for area-selective disposition of polymer thin films on metal/dielectric patterns.

In some embodiments, selectivity may also be affected by the polymer deposition thickness. In some deposition processes, for example, a polymer thin film may be selectively deposited on a target material up to a threshold deposition thickness, beyond which further deposition leads to loss of selectivity. Due to the cyclic nature of the spiCVD process described herein, selectivity can be maintained by determining the number of cycles needed to effectively coat the target material, while preventing polymer deposition on the non-target material(s). In some embodiments, the number of cycles may be determined based on the polymer growth rates achieved per spiCVD cycle on the target and non-target materials.

Experiments were initially conducted on planar blanket substrates of silicon dioxide ($SiO_2$) and copper (Cu) to demonstrate the viability of selectively depositing polymer thin films on dielectric and metal surfaces using spiCVD. In these experiments, polymer thin films were deposited on planar blanket substrates by sequentially exposing the surface of the substrates to a precursor followed by an initiator in a spiCVD process. In these experiments, glycidyl methacrylate (GMA) was used as the precursor and tert-butylperoxide (TBPO) was used as the initiator, which initiates GMA polymerization to form polyglycidyl methacrylate (pGMA) on the planar blanket substrates. The experiments were conducted for a variety of precursor exposure times and spiCVD cycles to measure the pGMA film thickness and surface roughness achieved per deposition cycle. After optimizing the deposition of pGMA on planar blanket substrates using spiCVD, additional experiments were performed to optimize the process on patterned substrates, such as substrates having $SiO_2$ and Cu line patterns.

In one experiment, spiCVD was used to deposit pGMA on a planar blanket $SiO_2$ substrate by first exposing the surface of the $SiO_2$ substrate to a GMA precursor to form a condensate layer on the $SiO_2$ substrate. The GMA precursor was supplied to the substrate surface at a vapor pressure of about 1 Torr and a temperature between 160° C. and 170° C. for a variety of precursor exposure times (e.g., 20 s, 60 s, 120 s and 240 s). When the $SiO_2$ substrate was exposed to the vapor-phase GMA precursor, the GMA precursor selectively condensed on surfaces having high chemical affinity for precursor chemisorption to form a precursor condensate layer. The precursor condensate layer was subsequently polymerized upon introduction of TBPO, which initiated GMA polymerization to form an ultrathin pGMA film on the $SiO_2$ substrate. The thickness of the deposited pGMA film was increased by performing additional cycles of the spiCVD process. The experiments proved that ultrafine tuning of the pGMA film thickness can be achieved by carefully controlling the GMA vapor pressure and the GMA exposure time.

Figure 2:
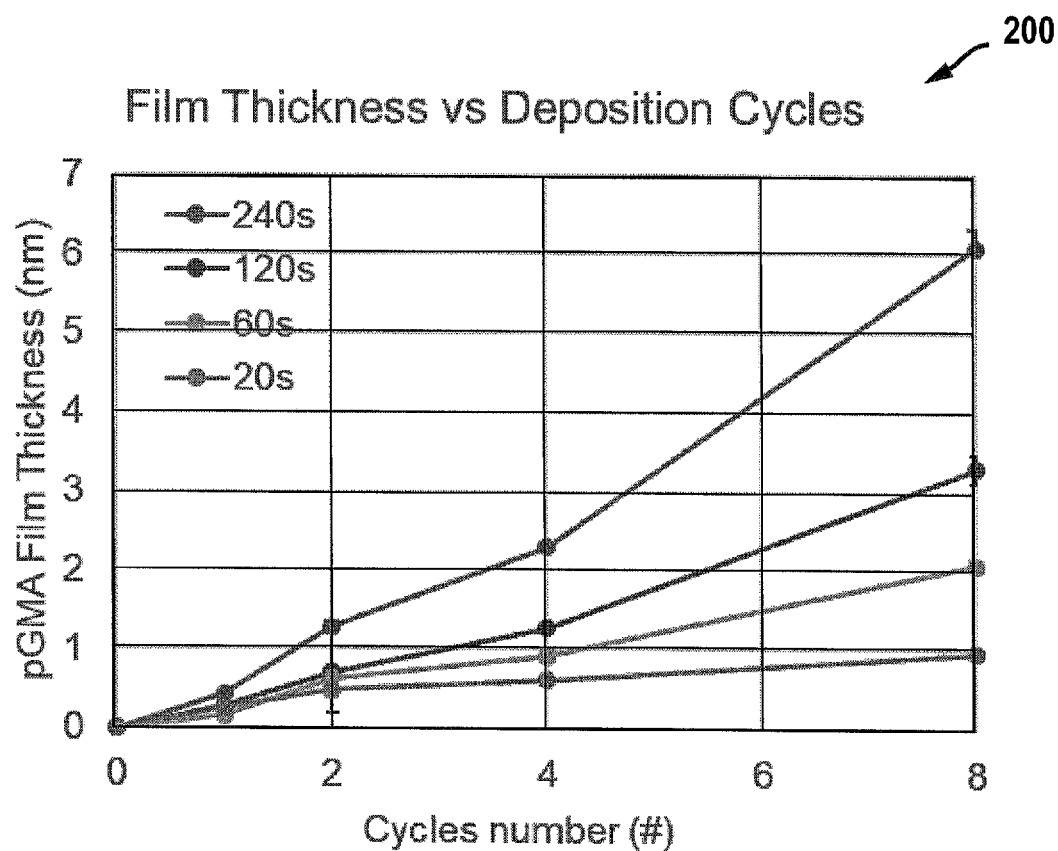
FIG. 2 is a graph illustrating example polymer film thicknesses (expressed in nanometers, nm) achieved as a function of cycle number for a range of monomer exposure times when a sequentially pulsed initiated chemical vapor deposition (spiCVD) process is used to deposit a polymer film.

From the preliminary study of polymer thin film deposition on blanket substrates, it was found that spiCVD could be used to provide uniform deposition of pGMA thin films ranging, e.g., between 1-10 nm. The graph 200 shown in FIG. 2 illustrates the pGMA film thickness (expressed in nanometers, nm) achieved using the spiCVD process described above for a variety of GMA precursor exposure times (e.g., 20 s, 60 s, 120 s and 240 s). As shown in the graph 200, the pGMA film thickness increases with increasing precursor exposure time and cycle number.

Figure 3:
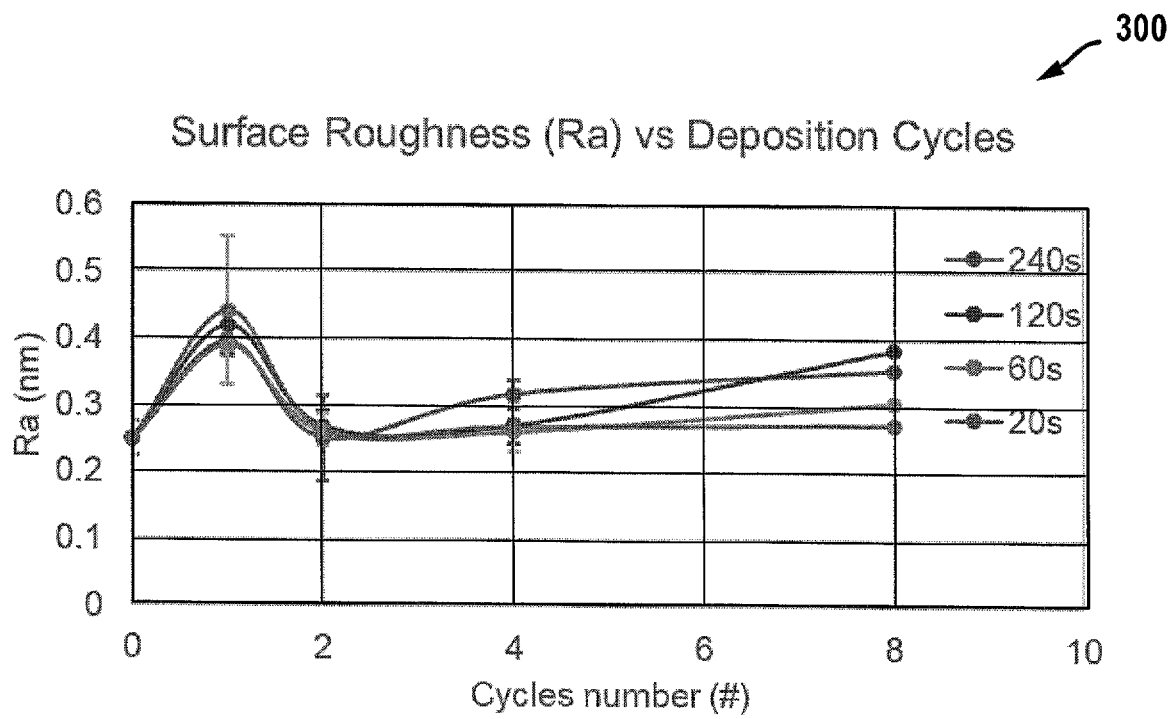
FIG. 3 is a graph illustrating example surface roughness (Ra, expressed in nm) of deposited polymer films achieved as a function of deposition cycle number for a range of monomer exposure times when a spiCVD process is used to deposit the polymer films.

The graph 300 shown in FIG. 3 illustrates the surface roughness (Ra) of the deposited pGMA film (expressed in nm) achieved using the spiCVD process described above for a variety of GMA precursor exposure times (e.g., 20 s, 60 s, 120 s and 240 s). As shown in the graph 300, the surface roughness initially increases during the first spiCVD cycle (due, e.g., to nuclei and short chain polymers) before the polymer film coalesces during the next spiCVD cycle, resulting in uniform deposition of an ultrathin polymer film. The degree of uniformity may generally depend on the type of substrate, or target material, on which the polymer film is deposited.

Figure 4:
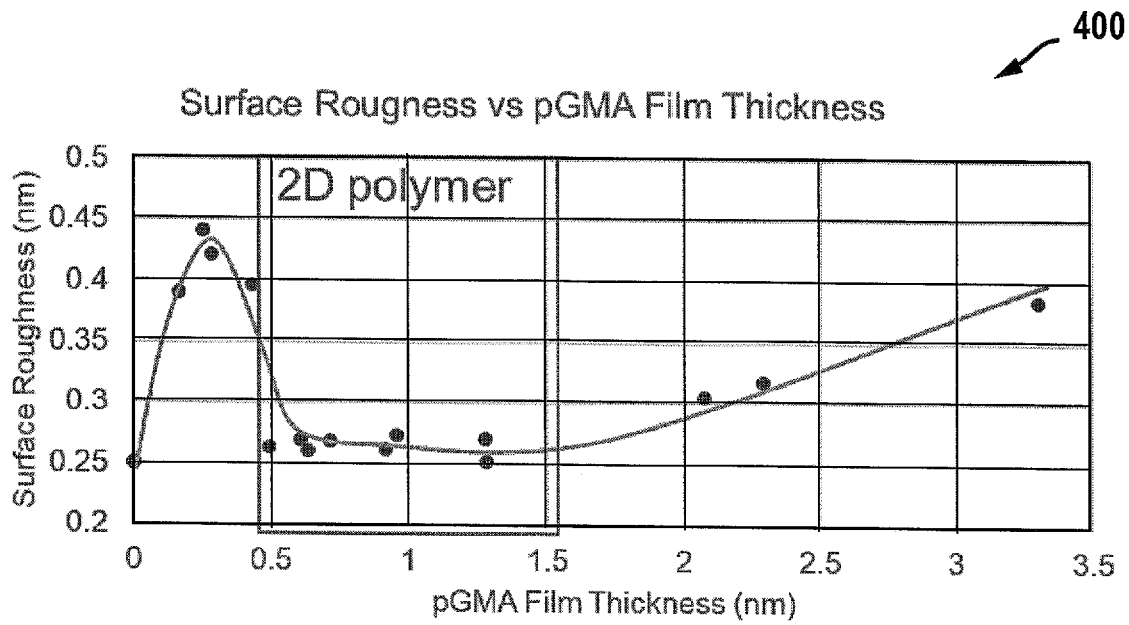
FIG. 4 is a graph illustrating example surface roughness (Ra, expressed in nm) of deposited polymer films, as measured by atomic force microscopy (AFM), at different polymer film thicknesses.

When depositing a pGMA thin film on a $SiO_2$ substrate, the spiCVD process described above was observed to follow a two-mode deposition process. The graph 400 shown in FIG. 4 is a plot of surface roughness of the deposited pGMA film (expressed in nm), as measured by atomic force microscopy (AFM), at different pGMA film thicknesses. The graph 400 shown in FIG. 4 shows two modes of growth. In the first mode, which is dictated by the substrate surface, a uniform ultrathin polymer film (otherwise referred to as a two-dimensional, or "2D" polymer film) of approximately 1-2 nm is deposited on the $SiO_2$ substrate surface with excellent blanket coverage. The degree of uniformity and surface coverage in such ultrathin polymer films is remarkable given their thickness. The second mode of deposition happens when additional spiCVD cycles are performed to achieve further polymer deposition on the 2D polymer film. At this stage, a bulk polymer film forms and follows the traditional iCVD growth behavior. At least part of the uniformity achieved for such 2D polymer films may be attributed to the sequential nature of the spiCVD process, which allows the precursor to distribute and "wet" the target surface thoroughly before it is polymerized. Such 2D polymer films can have important implications for a variety of surface coating applications, such as surface passivation, anti-corrosion application, surface activation, functionalization, etc.

In addition to blanket polymer films, the cyclic, sequential nature of the spiCVD process allows for area-selective deposition (ASD) of polymer films on a wide variety of target materials. In a pattern containing two different materials having different wettability against the precursor, the spiCVD process described herein can be used to selectively coat one material surface with a polymer thin film, while avoiding polymer coating of the other material surface. Polymer patterns deposited via spiCVD can have application in a wide variety of areas, including area-selective deposition (ASD) of polymers-on-dielectric, ASD of polymers-on-metal, ASD of polymers-on-SAM-passivated surfaces and carbon hard mask or photoresist-based pattern correction. Polymer thin films deposited via spiCVD can also act as dummy structures to direct growth, or etching, in a variety of structures. Thus, the present disclosure contemplates a wide variety of applications for which the techniques described herein can be used to deposit polymer thin films in IC fabrication.

Returning to the drawings, FIGS. 5-6 and 8 illustrate various embodiments of area-selective deposition (ASD) processes that can be used to selectively deposit polymer films on a variety of different target materials using a cyclic vapor deposition process. More specifically, 5-6 and 8 illustrate improved ASD processes that utilize spiCVD to selectively deposit polymer thin films on a variety of target materials (e.g., dielectric materials, metal and metal oxide materials, and SAM-passivated metal/metal oxides). It is recognized, however, that the processes shown in FIGS. 5-6 and 8 are merely example applications of the techniques described herein.

Selective Polymer-On-Dielectric (PoD) Deposition

Figure 5A:
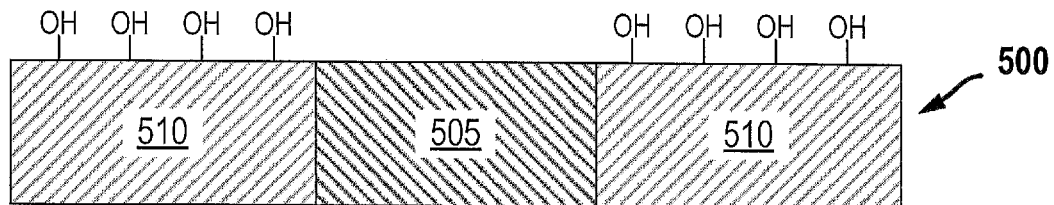
FIGS. 5A-5C illustrate one embodiment of a polymer-on-dielectric (PoD) process that utilizes spiCVD to selectively deposit polymer thin films on a dielectric material in accordance with the present disclosure.
Figure 5B:
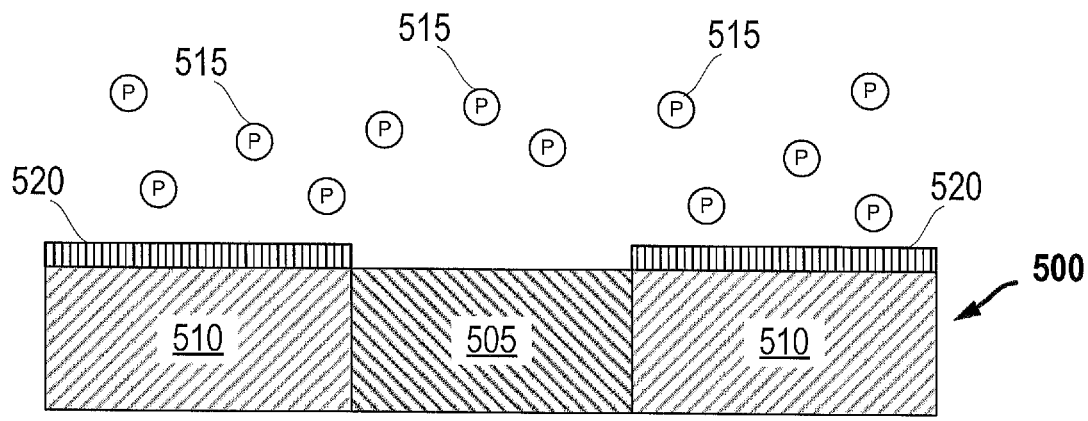
Figure 5C:
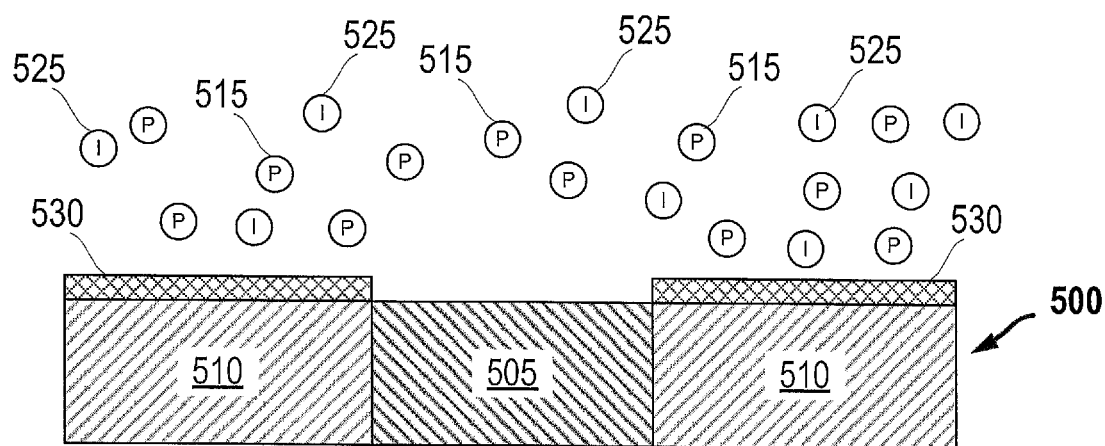

FIGS. 5A-5C illustrate an improved ASD process that can be used to selectively deposit a polymer thin film on a dielectric material in accordance with the present disclosure. More specifically, FIGS. 5A-5C illustrate an improved polymer-on-dielectric (PoD) process that utilizes spiCVD to selectively deposit polymer thin films on a dielectric material, while avoiding polymer deposition on non-target material(s), such as metal or metal oxide materials provided on the same substrate.

In the embodiment shown in FIG. 5A, a substrate 500 is provided with a metal/dielectric pattern having a metal layer 505 and a dielectric layer 510 exposed on a surface of the substrate 500. The metal layer 505 may include a wide variety of metal and metal oxide materials, such as but not limited to, copper (Cu), ruthenium (Ru), cobalt (Co), tungsten (W), molybdenum (Mo) and oxides thereof. The metal layer 505 may also include other metal and metal oxide materials commonly used in integrated circuit (IC) fabrication, as is known in the art. The dielectric layer 510 may include a wide variety of dielectric materials, including but not limited to, oxides, silicon oxides (including silicon dioxide, $SiO_2$) and other low-k and high-k dielectric materials commonly used in IC fabrication. Depending on the dielectric material used, the surface of the dielectric layer 510 may be terminated with —O, —H or —OH bonds.

In the embodiment shown in FIG. 5B, the surface of the substrate 500 is exposed to a vapor-phase precursor (P) 515, which chemically reacts with and bonds to the —OH bonds on the surface of the dielectric layer 510 to selectively form a thin condensate layer 520 on the dielectric surface. The condensate layer 520 selectively forms on the dielectric surface vs the metal surface because the —OH bonds have high affinity, and provide active sites, for precursor chemisorption, while the metal (or metal oxide) atoms residing on the surface of the metal layer 505 have low affinity for precursor chemisorption.

The precursor 515 used in FIG. 5B may include any monomer precursor, which: (a) can be deposited by chemical vapor deposition, and (b) can be initiated/activated by an initiator to achieve polymerization. In one embodiment, the precursor 515 used in FIG. 5B may be glycidyl methacrylate (GMA). Although GMA is provided as an example, precursor 515 is not strictly limited to GMA and may include other monomer precursors, such as but not limited to, alkyl acrylates, alkyl cyclosiloxane, perfluoroalkylethylmehacrylate, and trivinyltrimethylcyclotrisiloxane. In addition to precursor selection, the vapor pressure and exposure time of the precursor 515 may be carefully selected to provide a uniform, ultrathin coating of the condensate layer 520 on the surface of the dielectric layer 510 before the initiator is introduced in FIG. 5C.

In the embodiment shown in FIG. 5C, the surface of the substrate 500 is subsequently exposed to a vapor-phase initiator (I) 525, which reacts with and polymerizes the condensate layer 520 to form an ultrathin (e.g., 1-2 nm or less) polymer film 530 on the surface of the dielectric layer 510. The initiator 525 may include any chemical species, which: (a) can be deposited by chemical vapor deposition, and (b) reacts with a monomer to form an intermediate compound capable of linking successively with a large number of other monomers into a polymeric compound. In one embodiment, tert-butylperoxide (TBPO) may be used as the initiator 525. When TBPO is introduced in FIG. 5C, TBPO initiates polymerization of GMA to form poly-glycidyl methacrylate (pGMA). Although TBPO is provided as an example, other initiators may also be used to activate precursor 515 and cause polymerization of the condensate layer 520 to form the polymer film 530. Examples of other initiators include, but are not limited to, perfluorooctane sulfonyl fluoride, triethylamine and organic peroxides. Alternative initiation may be done using photons (e.g., UV photons), electron beam, or via thermal means.

After the polymer film 530 is formed, the process of sequentially exposing the surface of the substrate 500 to the precursor 515 in FIG. 5B and the initiator 525 in FIG. 5C can be repeated for one or more cycles of the spiCVD process described herein until a desired amount (or a predetermined thickness) of the polymer film 530 is selectively grown or deposited on the surface of the dielectric layer 510. In some embodiments, the sequential process steps shown in FIGS. 5B and 5C may be repeated for approximately 32 cycles to selectively deposit up to 16 nm of polymer film 530 on the dielectric layer 510. In other examples, anywhere from 1 to 40 cycles (or even more) may be utilized to provide from 0.5 to 20 nm of film depending upon the precursor exposure time. In some embodiments, the number of cycles needed to effectively coat the dielectric surface, while avoiding contamination of the metal surface, may be determined based on the polymer growth rate achieved per cycle of the spiCVD process, and may be used to maintain selectivity.

Experiments were conducted to selectively deposit a pGMA film on a patterned substrate consisting of line patterns of interlayer dielectric (ILD) and copper (Cu) using the spiCVD process shown in FIGS. 5A-5C and described above. Using the spiCVD process described above, a pattern of polymer having a thickness ranging from 1-16 nm was formed on the ILD lines without significant contamination of the copper surfaces. This selectivity was driven, at least in part, by a wetting/de-wetting mechanism, which enables the GMA monomer (or another monomer having a high affinity for ILD surfaces versus Cu surfaces) to selectively coat or "wet" the ILD surfaces without contaminating the copper surfaces. After the ILD surfaces are covered with a GMA condensate, residual GMA molecules may further de-wet from the neighboring copper surfaces, due to the higher affinity of the GMA molecules to assemble with the GMA condensate. This mechanism is very effective at directing selective polymer growth with excellent pattern geometry. Selective condensation on ILD vs copper can be driven by a combination of chemical and physical interactions on the target and non-target surfaces, and is expected to vary by types of polymer precursor.

Selective Dielectric-On-Dielectric (DoD) Deposition

In some embodiments, the selective PoD process shown in FIGS. 5A-5C can be used in back end of the line (BEOL) during IC fabrication to form dielectric-on-dielectric (DoD) patterns. In one example BEOL application, the spiCVD process shown in FIGS. 5A-5C may be used to selectively deposit a low-k dielectric film on a dielectric pattern used to fabricate fully self-aligned vias (FSAVs). Instead of exposing the surface of the substrate 500 to a monomer precursor, however, the substrate surface may be exposed to a dielectric precursor 515 in FIG. 5B to form a dielectric condensate layer 520.

The dielectric precursor used in the DoD process to deposit a low-k dielectric film on a dielectric pattern may be any dielectric precursor, which can be deposited by chemical vapor deposition, for example, by spiCVD. In one embodiment, the dielectric precursor 515 may be a precursor for low-k dielectric materials, such as those based on polysiloxane. After sufficient exposure to the dielectric precursor 515, the surface of the substrate 500 may be exposed to an initiator 525, which reacts with and polymerizes the dielectric condensate layer 520 to form a low-k dielectric film 530 on the surface of the dielectric layer 510. In some embodiments, the sequential process steps shown in FIGS. 5B and 5C may be repeated for a plurality of cycles (e.g., 1 to 40 cycles) to selectively deposit up to 20 nm of low-k dielectric film 530 on the dielectric layer 510.

The cyclic, sequential nature of the spiCVD process enables uniform low-k dielectric films to be selectively deposited on dielectric surfaces, while avoiding contamination of non-target area(s), such as metal and metal oxide surfaces provided on the same substrate. In some embodiments, the spiCVD process described herein may be used to perform a single-step DoD (e.g., for FSAV fabrication) with no need to passivate metal patterns with SAM or the like. Low-k dielectric materials, such as poly(1,3,5-trimethyl-1,3,5-trivinyl cyclotrisiloxane) (pV3D3), can be used for this purpose. Similar behavior is expected for other low-k dielectric polymers that can be deposited via spiCVD.

Selective Polymer-On-Metal (PoM) Deposition by Reversing Selectivity with Molecular Adsorbates During IC fabrication, it is sometimes desirable to selectively deposit a polymer layer on a metal surface in the presence of dielectric surfaces. To achieve selective polymer-on-metal (PoM) deposition, the intrinsic polymer-on-dielectric (PoD) selectivity described above and shown in FIGS. 5A-5C can be reversed with the aid of a molecular adsorbate, such as but not limited to, a self-assembled monolayer.

As noted above, self-assembled monolayers (SAMs) are organic molecules that form ordered surface monolayer coatings on materials, thereby modifying the chemical and/or physical properties of the material's surface. Because SAM-forming molecules having thiol, amines or carboxylic acid head-groups have a higher chemical affinity to metal surfaces than dielectric surfaces, they assemble selectively on metal versus dielectric materials. Thus, these SAM-forming molecules can be used to enable selective condensation of a monomer on a metal surface.

FIGS. 6A-6D illustrate an improved ASD process that can be used to selectively deposit a polymer thin film on a metal material in accordance with the present disclosure. More specifically, FIGS. 6A-6E illustrate an improved polymer-on-metal (PoM) process that utilizes spiCVD to selectively deposit polymer thin films on a SAM-passivated metal (or metal oxide) material, while avoiding polymer deposition on non-target material(s), such as dielectric materials provided on the same substrate.

Figure 6A:
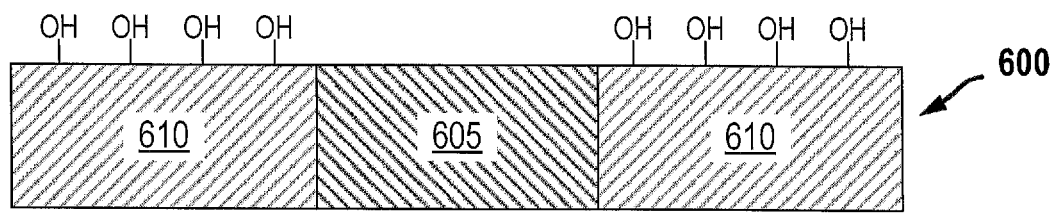
FIGS. 6A-6D illustrate one embodiment of a polymer-on-metal (PoM) process that utilizes spiCVD to selectively deposit polymer thin films on a SAM-passivated metal (or metal oxide) material in accordance with the present disclosure.

The spiCVD process shown in FIGS. 6A-6D is similar to that shown in FIGS. 5A-5C and may generally begin by providing a substrate 600 with a metal/dielectric pattern having a metal layer 605 and a dielectric layer 610 exposed on a surface of the substrate 600 in FIG. 6A. Metal layer 605 and dielectric layer 610 may each include a wide variety of materials, as noted above with regard to FIG. 5A. In one example embodiment, metal layer 605 may include a copper (Cu) material and dielectric layer 610 may include an interlayer dielectric (ILD).

As noted above, metal (or metal oxide) atoms residing on the surface of the metal layer 605 tend to have low chemical affinity, while the —O, —H or —OH bonds on the surface of the dielectric layer 610 tend to have high chemical affinity for precursor chemisorption. Due to the differences in chemical affinity, polymers deposited via chemical vapor deposition tend to selectively condensate on dielectric surfaces, while avoiding metal surfaces. However, the inherent selectivity to dielectric surfaces can be reversed by using a molecular adsorbate, such as a SAM, to modify the chemical and/or physical surface properties of the metal layer 605. As described in more detail below, a SAM formed on a metal or metal oxide surface can be used as a condensation medium for a vapor-phase monomer precursor.

Figure 6B:
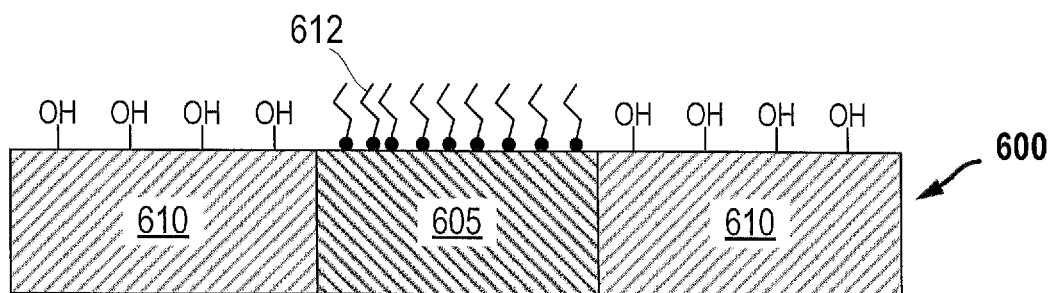

In the embodiment shown in FIG. 6B, a SAM structure 612 is formed on the surface of the metal layer 605 to modify the chemical and/or physical surface properties of the metal layer 605 and form a SAM-passivated metal or metal oxide. As known in the art, SAM-forming molecules consist of a head group, a tail and a functional end group. Self-assembled monolayers (or SAMs) are created by the chemisorption of the head groups onto a target surface, either through vapor or liquid phase, followed by a slow organization of the tail groups. Because the head groups have high chemical affinity to the target surface, they assemble together on the target surface, while the tail groups assemble away from the target surface. Areas of closely packed SAM-forming molecules nucleate and grow until the target surface is covered in a single self-assembled monolayer, or SAM structure. Common head groups include thiols, amines, carboxylic acids, silanes, phosphonates, etc. As noted above, SAM-forming molecules having thiol, amine and carboxylic acid head groups are known for having high chemical affinity to metals, and thus, may be used to selectively assemble on the surface of the metal layer 605 to form the SAM structure 612. In one example embodiment, a CH- or CF-type thiol SAM structure 612 may be formed on the surface of the metal layer 605 via chemical vapor deposition.

Figure 6C:
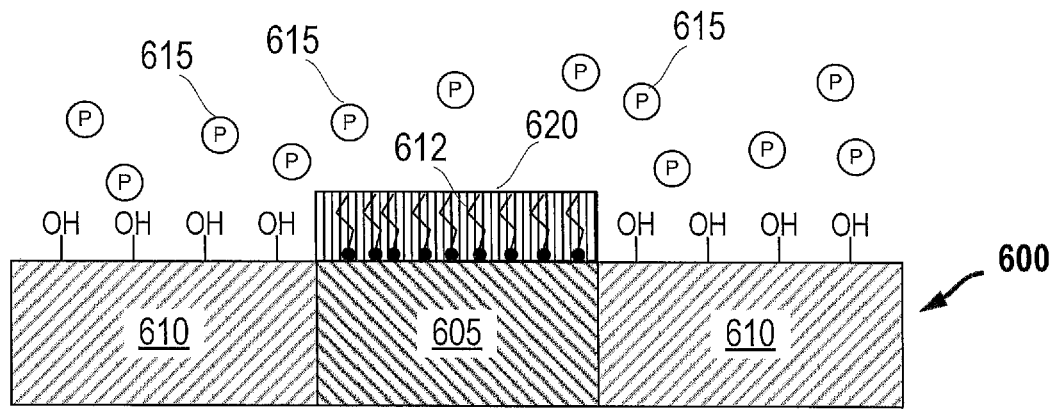

In the embodiment shown in FIG. 6C, the surface of the substrate 600 is exposed to a vapor-phase precursor (P) 615, which selectively condenses within and over the SAM structure 612 to form a thin condensate layer 620 in/on the SAM structure 612. In one embodiment, the precursor 615 used in FIG. 6C may be GMA. However, precursor 615 is not strictly limited to GMA and may include other monomer precursors, which: (a) can be deposited by CVD, and (b) can be initiated/activated by an initiator to achieve polymerization. Examples of other monomers are discussed in more detail above.

The SAM structure 612 formed on the surface of the metal layer 605 in FIG. 6B passivates the metal layer 605 by modifying the chemical and physical properties of the metal surface. This passivation reverses the inherent polymer-on-dielectric (PoD) selectivity of the polymer deposition process and enables the SAM structure 612 to act as condensation medium for the precursor 615 in FIG. 6C. In some embodiments, the vapor pressure and/or exposure time of the precursor 615 may be carefully controlled to selectively condense the monomer precursor within and over the SAM structure 612, thus providing a uniform, ultrathin coating of the condensate layer 620 in/on the SAM-passivated metal layer 605 before the initiator is introduced in FIG. 6D.

In the embodiment shown in FIG. 6D, the surface of the substrate 600 is subsequently exposed to an initiator (I) 625, which reacts with and polymerizes the condensate layer 620 to form an ultrathin (e.g., 1-2 nm or less) polymer film 630 in/on the SAM-passivated metal layer 605. In one embodiment, TBPO may be used to initiate polymerization of GMA to form a pGMA polymer film. However, the initiator 625 is not strictly limited to TBPO and may include other initiators, which can initiate polymerization of the condensate layer 620 in FIG. 6D. Examples of other initiators that may be used in FIG. 6D are discussed in more detail above.

Figure 6D:
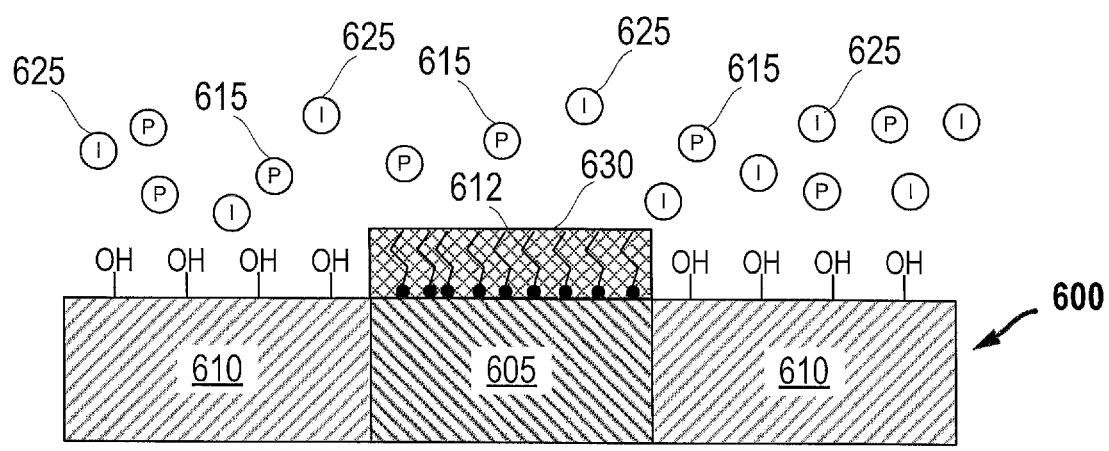

After a polymer film 630 is initially formed on the SAM-passivated metal layer 605, the process of sequentially exposing the surface of the substrate 600 to the precursor 615 in FIG. 6C and the initiator 625 in FIG. 6D can be repeated for one or more spiCVD cycles until a desired amount (or a predetermined thickness) of the polymer film 630 is selectively deposited on the SAM-passivated metal layer 605. In some embodiments, the sequential process steps shown in FIGS. 6C and 6D may be repeated for a plurality of cycles (e.g., 3 to 6 cycles) to selectively deposit up to 3 nm of the polymer film 630 on the SAM-passivated metal layer 605.

Figure 7A:
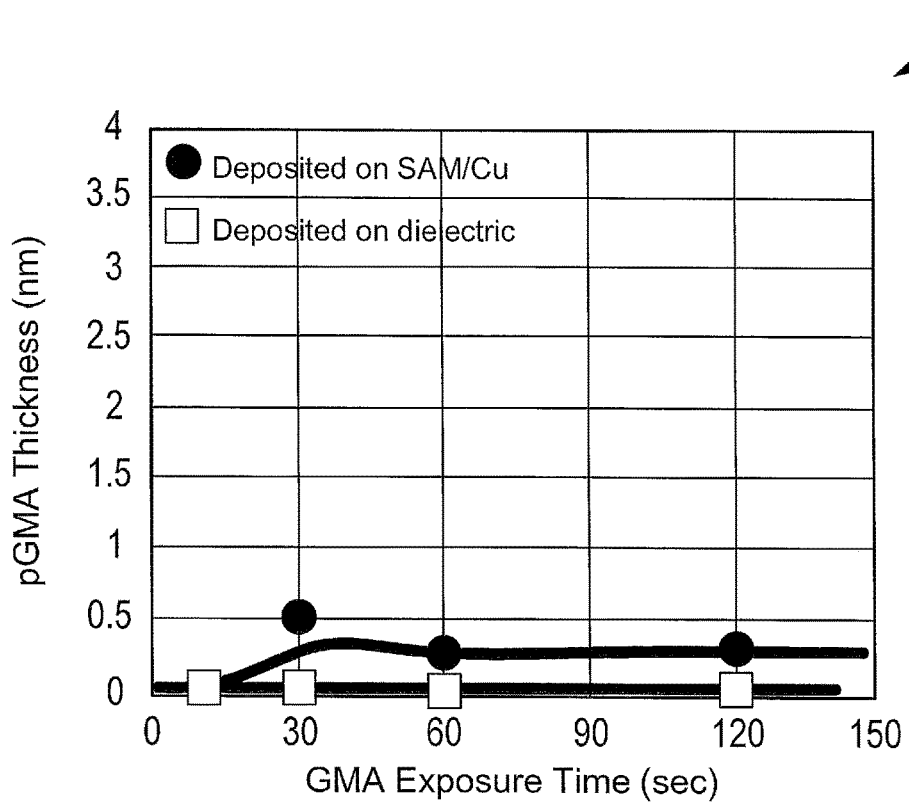
FIGS. 7A-7B are graphs illustrating experimental results obtained to determine a selectivity window for depositing a pGMA thin film, via spiCVD, on patterns containing interlayer dielectric (ILD) and SAM-passivated copper lines.
Figure 7B:
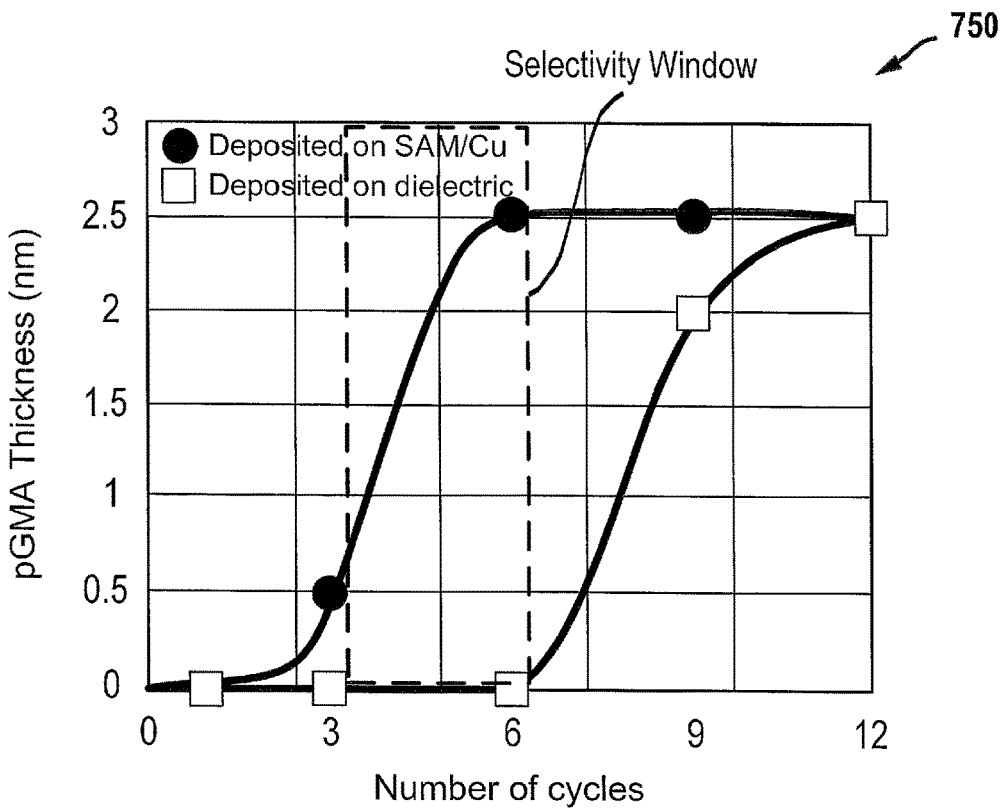

In some embodiments, the number of cycles needed to effectively coat the SAM-passivated metal layer 605, while avoiding contamination of the dielectric layer 610, may be selected from a selectivity window. This selectivity window may be obtained from experimental results and determined, for example, based on the polymer growth rates achieved per spiCVD cycle on the target (SAM-passivated metal) and non-target (dielectric) surfaces. FIGS. 7A-7B illustrate one method for determining a selectivity window between a SAM-passivated copper layer and an interlayer dielectric (ILD) surface. Similar methods may be used for determining selectivity windows for depositing polymers on other target and non-target surfaces. Once a selectivity window is determined for a particular pattern, it may be used to maintain selectivity throughout the polymer deposition process.

The graphs 700 and 750 depicted in FIGS. 7A-7B show experimental results obtained to determine a selectivity window for pGMA deposition, via spiCVD, on patterns containing ILD and SAM-passivated copper lines. The graph 700 depicted in FIG. 7A shows the pGMA growth (expressed in nm) vs GMA exposure time (expressed in seconds) for one cycle of spiCVD. The graph 750 depicted in FIG. 7B shows the pGMA growth (expressed in nm) vs spiCVD cycles (expressed in number of cycles) for pGMA films deposited on the ILD and SAM-passivated copper lines. The experimental results depicted in FIGS. 7A-7B show that pGMA is selectively deposited on the SAM-passivated copper lines up to a threshold number of spiCVD cycles (e.g., up to 6 cycles). After this threshold, further polymer deposition leads to contamination of the dielectric surfaces and loss of selectivity.

As shown in FIG. 7B, a selectivity window of 3-6 spiCVD cycles may be used to deposit up to approximately 3 nm of pGMA on the SAM-passivated copper lines without significantly contaminating the ILD surfaces. Beyond this selectivity window, the selectivity between the SAM-passivated copper lines and the ILD surfaces decreases, which may allow polymer to deposit on the dielectric surfaces. In some embodiments, selectivity may be improved outside of the selectivity window by passivating the dielectric layer 610.

In the embodiment shown in FIGS. 6A-6D, the intrinsic polymer-on-dielectric (PoD) selectivity of the polymer deposition process is reversed by forming a SAM structure 612 on the surface of the metal layer 605 before exposing the substrate to the precursor 615. The SAM structure 612 reverses the inherent PoD selectivity of the polymer deposition process and enables the polymer precursor 615 to selectively condensate within and over the SAM structure 612. Condensation formation on the dielectric layer 610 surfaces is avoided by selecting the number of cycles needed to effectively coat the metal layer 605 with the SAM structure 612 from a predetermined selectivity window, as shown for example in FIG. 7B.

It is hypothesized that a combination of chemical and physical forces may contribute to the reverse selectivity mechanism described above. Due to their weak interaction (e.g., mostly Van der Waal forces and hydrogen bonding), SAM-forming molecules deposited on metal surfaces present a significant amount of sub-surface free volume, while missing SAM molecules (due to imperfect surface coverage) make up for high aspect ratio sub-nano sized pinholes. These volumes allow for increased residence time of the incoming monomers, thus artificially lowering their surface saturation pressure, leading to preferential condensation of the monomer on the SAM structure 612 versus the dielectric layer 610 surfaces. The chemical affinity of the precursor 615 to the SAM structure 612 additionally leads to de-wetting of any residual monomer from the surface of the dielectric layer 610, further enhancing selectivity. However, the selectivity of the polymer deposition process is also dependent on the thickness of the deposited polymer film 630. As noted above, selectivity can be maintained by selecting a polymer deposition thickness within a selectivity window determined for a particular pattern.

The ASD processes shown in FIGS. 5-6 and described above provide a variety of advantages over conventional ASD techniques. For example, the ASD processes utilize spiCVD to selectively deposit polymer thin films on a variety of target materials, including dielectric materials, metal and metal oxide materials, and SAM-passivated metal/metal oxides. By using spiCVD, the ASD processes described herein can be used to provide a highly reproducible, uniform, and thermally and mechanically stable 2D polymer thin film. The sequential nature of spiCVD allows for controlled coating of ultrathin amounts (e.g., 1-2 nm or less) of polymer on a target material. In some embodiments, the amount of polymer selectively deposited on the target material, per spiCVD cycle, can be controlled by varying the precursor exposure time, precursor vapor pressure, temperature and/or surface properties of the target material. Thus, spiCVD can be used in the ASD processes described herein to fine tune the amount of polymer deposited on the target material, and can sometimes be used to provide angstrom (Å) level control of the polymer deposition process. The cyclic nature of spiCVD provides a more uniform deposition of the polymer film on the target material, while the precursor drives the selectivity of the deposition by enabling area-selective deposition in patterns of material having different wetting properties.

The ASD processes described herein may be utilized within a wide variety of applications. For example, the ASD process shown in FIGS. 5A-5C may be used to provide selective polymer-on-dielectric (PoD) deposition with excellent vertical profile in patterns of interlayer dielectric (ILD) and copper (Cu) lines. Similar selectivity is expected for other metal and metal oxide surfaces, such as but not limited to, ruthenium (Ru), cobalt (Co), tungsten (W), molybdenum (Mo) and oxides thereof. In some embodiments, the ASD process shown in FIGS. 5A-5C may alternatively be used to provide selective dielectric-on-dielectric (DoD) deposition by replacing the monomer precursor used in FIG. 5B with a low-k dielectric precursor (e.g., pV3D3 or similar). In addition, the ASD process shown in FIGS. 6A-6D may be used to provide selective polymer-on-metal (PoM) deposition by using a SAM structure as nucleation enhancer. The SAM structure used in these embodiments acts as a condensation medium for the monomer precursor and reverses the inherent PoD selectivity by driving selective polymer growth on the metal surfaces vs. the dielectric surfaces.

In addition to selective PoD, DoD and PoM, the selectivity provided by the ASD processes described herein can be extended to selectively form polymer thin films on a variety of other materials and patterns, such as for example, carbon hard masks (HMs) and extreme ultraviolet (EUV) photoresist (PR) patterns. The ASD processes described herein can also be used to provide nanoscale masks, dummy structures and removable templates. Using the techniques described herein, polymer thin films can be selectively deposited onto a variety of target surfaces with relatively easy application and removal. For example, the polymer thin films can be removed by gentle oxidation, thermal decomposition, hydrogen ($H_2$) plasma, etc. Other advantages may be apparent to one skilled in the art.

Selective Dielectric-On-Dielectric (DoD) Deposition Via SAM Passivation

Selective dielectric-on-dielectric (DoD) growth is one approach that may be used to ensure reliability when fabricating fully self-aligned vias (FSAVs) in the BEOL. Currently available DoD processes use self-assembled monolayers (SAMs) to passivate the metal lines (e.g., copper lines) and allow for selective dielectric growth on the interlayer dielectric (ILD) patterns. Unfortunately, SAMs suffer from low thermal, mechanical, and shelf-life stability, rendering them less effective for selective DoD applications.

Figure 1B:
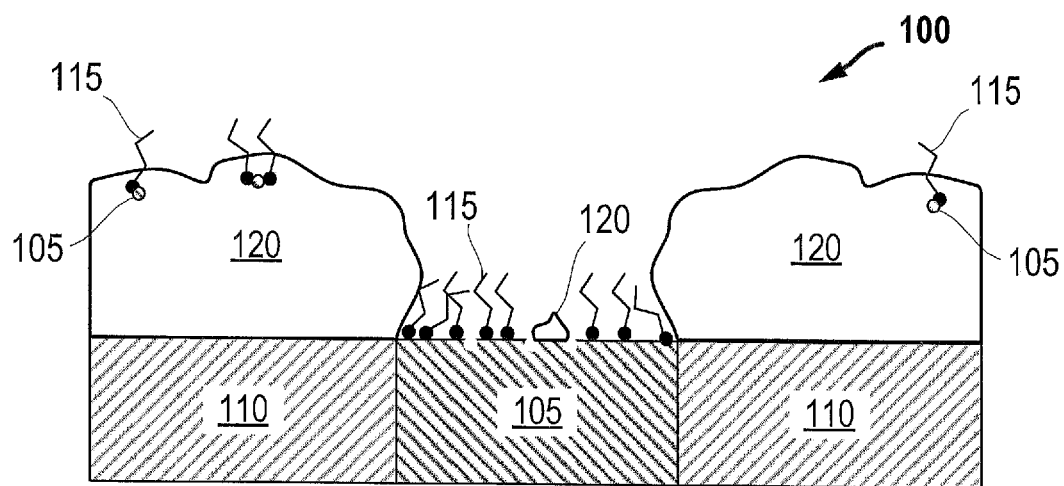

As noted above, SAM-forming molecules may rearrange, desorb, and even migrate to the neighboring dielectric pattern, pulling metal impurities with them, during processing or over prolongated storage (see, e.g., FIG. 1B). These events compromise the SAM's ability to effectively enable selective DoD without reliability concerns. Defects in the SAM may also lead to incomplete blanket coverage of the metal feature, which may allow dielectric material to grow on the metal feature and cause additional reliability concerns. Finally, since a SAM is only a few nm thick, and flexible in nature, it is not ideal for directing the vertical growth of dielectric patterns in selective DoD applications. This leads to mushrooming of the dielectric material over the metal feature, as shown in FIG. 1B, thus compromising the critical dimensions of the pattern.

SAM Stabilization with Polymer Topcoat to Improve Selective Dielectric-On-Dielectric (DoD) Processes In addition to providing improved ASD processes and methods for depositing polymer thin films on both dielectric and metal surfaces, the present disclosure also provides improved processes and methods for stabilizing self-assembled monolayers (SAMs) deposited on a target surface. In present disclosure, a cyclic vapor deposition process is used to selectively deposit (or coat) a SAM structure with a polymer thin film. In at least one preferred embodiment, a spiCVD process is used to selectively deposit a polymer thin film on the SAM structure, thus providing a polymer topcoat on the SAM. Although the term "topcoat" is used herein to describe the deposited polymer, it does not necessarily mean that the polymer is strictly deposited or coated on only the top surface of the SAM structure. Instead, a portion of the polymer may be interdigitated within the SAM-forming molecules. The extent of interdigitation, as well as that of the top-coating, may be dependent on a variety of factors such as the density of the SAM, the chemical structure of the SAM and the polymer, and the amount of polymer applied to the SAM.

As described in more detail below, the polymer topcoat approach not only stabilizes the SAM structure, but also heals any defects in the SAM structure originally formed on the target surface. In some embodiments, the polymer topcoat approach may be used to reduce or eliminate reliability concerns that typically occur when SAMs are used in selective DoD applications. In addition to providing excellent blanket coverage on the metal lines, the polymer topcoat approach described herein effectively alleviates all of the reliability issues presented above. For example, the polymer topcoat improves the thermal and shelf stability of the SAM structure by reinforcing the SAM structure. The polymer topcoat also forms an interdigitated blanket within and over the SAM structure, thus further enhancing its ability to block dielectric nuclei from reaching the metal surface during DoD applications. Finally, the polymer topcoat provides the SAM structure with have a thicker and more rigid structure, which allows for better dielectric vertical growth and prevents mushrooming of the dielectric material over the metal lines.

FIGS. 8A-8E illustrate an improved process for stabilizing a self-assembled monolayer (SAM) structure in accordance with the present disclosure. More specifically, FIGS. 8A-8E illustrate an improved process that utilizes spiCVD to selectively deposit polymer thin films in/on a SAM structure, thereby stabilizing the SAM structure with a polymer topcoat. In the embodiment shown in FIGS. 8A-8E, a polymer thin film is selectively deposited on a SAM-passivated metal surface to: (a) heal defects in the SAM structure and provide blanket coverage over the metal surface, (b) prevent migration of SAM-forming molecules to neighboring dielectric surfaces, and (c) increase the thickness and rigidity of the SAM structure to direct vertical growth of dielectric patterns subsequently formed on the dielectric surfaces. Although described in the context of DoD applications, the process described herein may be also used to stabilize SAM assemblies utilized in other applications.

Figure 8A:
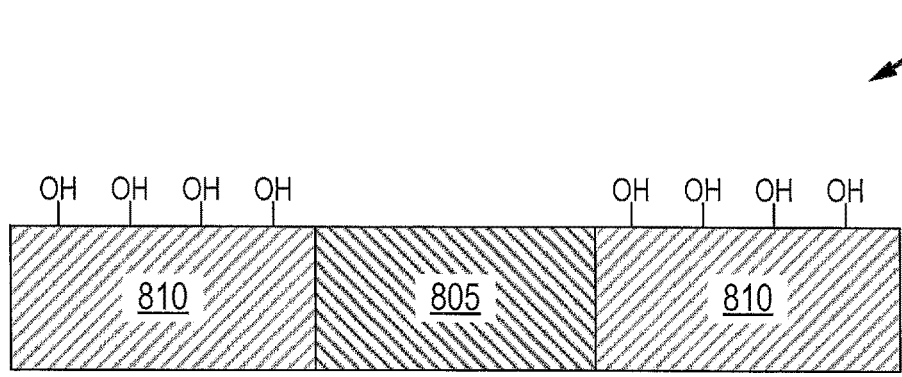
FIGS. 8A-8E illustrate one embodiment of a dielectric-on-dielectric (DoD) process that utilizes spiCVD to selectively deposit a polymer thin film on a self-assembled monolayer (SAM) structure to stabilize the SAM structure in accordance with the present disclosure.

Like the previous embodiments, the embodiment shown in FIG. 8A may generally begin by providing a substrate 800 with a metal/dielectric pattern having a metal layer 805 and a dielectric layer 810 exposed on a surface of the substrate 800. Metal layer 805 and dielectric layer 810 may each include a wide variety of materials, as noted above with regard to FIG. 5A. In one example embodiment, metal layer 805 may include a copper (Cu) material and dielectric layer 810 may include an interlayer dielectric (ILD) material.

Figure 8B:
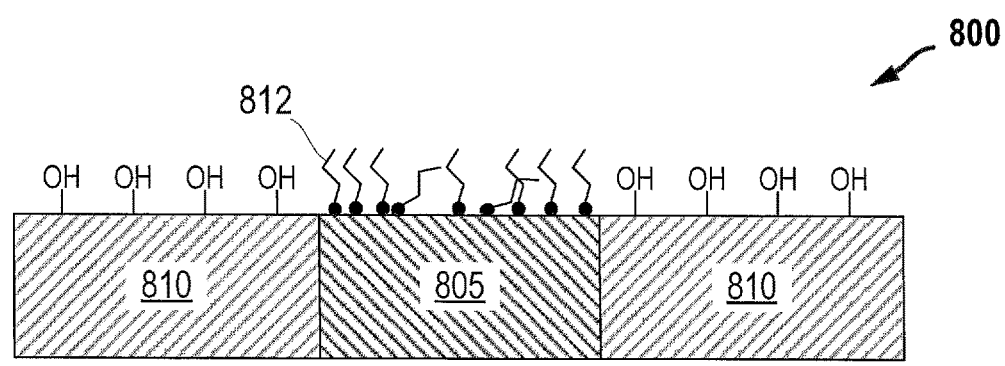

In the embodiment shown in FIG. 8B, a SAM structure 812 is formed on the surface of the metal layer 805. In one example embodiment, a CH- or CF-type thiol SAM structure 812 may be formed on the surface of the metal layer 805 via chemical vapor deposition. As shown in FIG. 8B, the SAM structure 812 formed on the surface of the metal layer 805 is a thin layer (i.e., single monolayer) of SAM-forming molecules, which in many cases, may have defects that prevent the SAM structure 812 from completely covering the metal surface. In order to heal the defects and increase the thickness and rigidity of the SAM structure 812, a polymer topcoat may be selectively deposited in/on the SAM structure 812, as shown in FIGS. 8C-8D and described in more detail below.

Figure 8C:
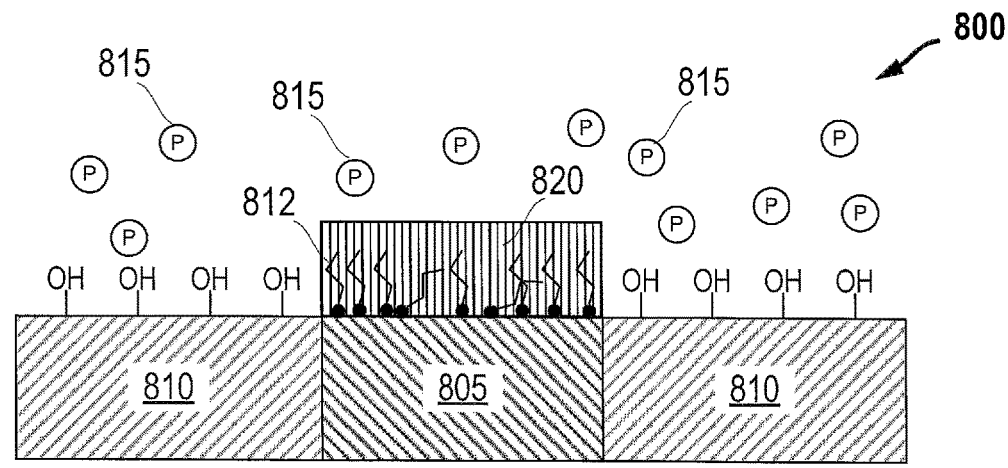

In the embodiment shown in FIG. 8C, the surface of the substrate 800 is exposed to a vapor-phase precursor (P) 815, which selectively condenses within and over the SAM structure 812 to form a condensate layer 820 within and over the SAM structure 812. In one embodiment, the precursor 815 used in FIG. 8C may be GMA. However, precursor 815 is not strictly limited to GMA and may include other monomer precursors, which: (a) can be deposited by CVD, and (b) can be initiated/activated by an initiator to achieve polymerization. Examples of other monomer precursors that may be used in FIG. 8C are discussed in more detail above. In some embodiments, the vapor pressure and exposure time of the precursor 815 may be carefully controlled to selectively condense the monomer within and over the SAM structure 812 before the initiator is introduced in FIG. 8D.

In the embodiment shown in FIG. 8D, the surface of the substrate 800 is subsequently exposed to an initiator (I) 825, which reacts with and polymerizes the condensate layer 820 to form an ultrathin (e.g., 1-2 nm or less) polymer film 830 that is interdigitated with the SAM structure 812. In one embodiment, TBPO may be used to initiate polymerization of GMA to form a pGMA polymer film. However, initiator 825 is not strictly limited to TBPO and may include other initiators, which can initiate polymerization of the condensate layer 820. Examples of other initiators that may be used in FIG. 8D are discussed in more detail above.

Figure 8D:
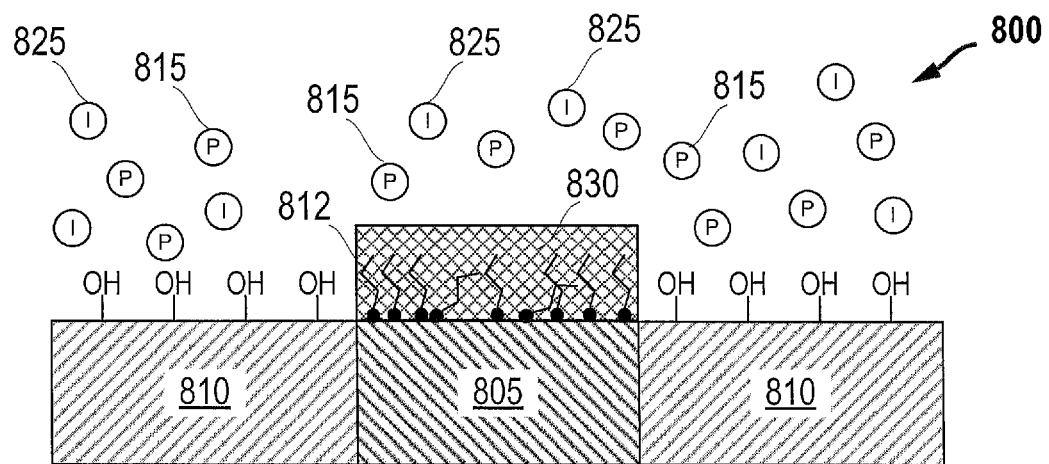

After a polymer film 830 is initially formed on the SAM structure 812, the process of sequentially exposing the surface of the substrate 800 to the precursor 815 in FIG. 8C and the initiator 825 in FIG. 8D can be repeated for one or more cycles of the spiCVD process described herein until a desired amount (or a predetermined thickness) of the polymer film 830 is selectively deposited in/on the SAM structure 812. In some embodiments, the sequential process steps shown in FIGS. 8C and 8D may be repeated for a plurality of cycles (e.g., 3 to 10 cycles) to selectively deposit up to 5 nm of the polymer film 830 on the SAM structure 812.

In some embodiments, the number of cycles needed to topcoat the SAM structure 812 with the polymer film 830, without contaminating the dielectric layer 810, may fall within a selectivity window, which may be determined, e.g., based on the polymer growth rates achieved per spiCVD cycle on the target (SAM) and on non-target (dielectric) surfaces. FIGS. 7A-7B illustrate one method for determining a selectivity window between a SAM-passivated copper layer and an interlayer dielectric (ILD) surface. Similar methods may be used for determining selectivity windows for depositing polymers on other target and non-target surfaces. Once the selectivity window is determined for a particular pattern, it may be used to maintain selectivity throughout the polymer deposition process.

Figure 8E:
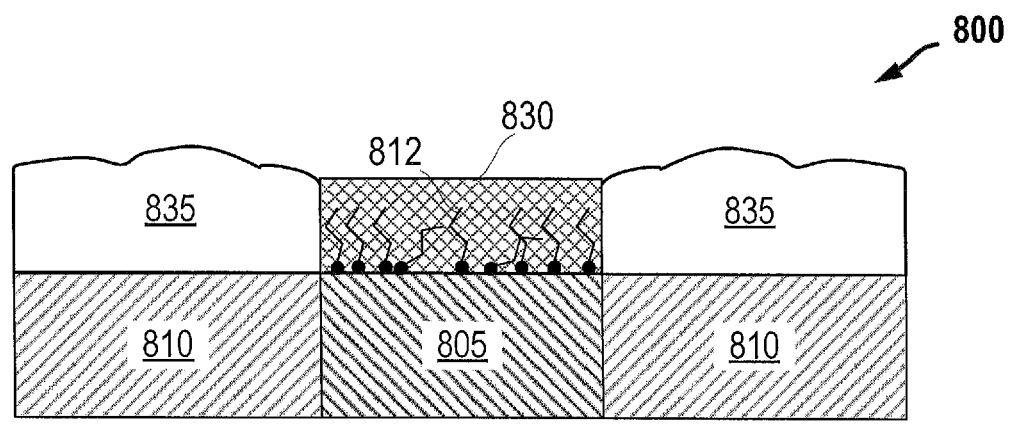

In the embodiment shown in FIG. 8E, dielectric material 835 is deposited on the surface of the dielectric layer 810 via chemical vapor deposition or atomic layer deposition. In some embodiments, the dielectric material 835 may be deposited by exposing the surface of the substrate to a dielectric precursor, which reacts with and bonds to the surface of the dielectric layer 810 to selectively deposit the dielectric material 835 on the surface of the dielectric layer 810. In some embodiments, the dielectric precursor may be a precursor for low-k dielectric materials, such as those based on polysiloxane. In the case of chemical vapor deposition or atomic layer deposition, the precursor may be oxidized by an oxidizer to form oxide (i.e., the dielectric). Operating parameters, such as the vapor pressure, dielectric precursor exposure time, temperature, etc., may be controlled to deposit a predetermined thickness of the dielectric material 835 on the surface of the dielectric layer 810.

As shown in FIG. 8E, the polymer film 830 formed in/on the SAM structure 812 stabilizes the SAM structure 812 by: (a) healing defects in the SAM structure 812 and providing blanket coverage over the metal layer 805 surface, (b) preventing migration of SAM-forming molecules to neighboring dielectric material 835 surfaces, and (c) increasing the thickness and rigidity of the SAM structure 812 to direct vertical growth of the dielectric material 835 and prevent mushrooming of the dielectric material 835 over the metal layer 805.

Experiments were conducted to selectively deposit a pGMA film on a patterned substrate comprising silicon dioxide ($SiO_2$) and SAM-passivated copper (Cu) line patterns using the spiCVD process shown in FIGS. 8A-8E and described above. In one experiment, a spiCVD process was used to deposit pGMA on the SAM-passivated copper lines by first exposing the substrate surface to a GMA precursor to form a condensate layer on the SAM-passivated copper lines. The GMA precursor was supplied to the substrate surface at a vapor pressure of about 1 Torr and a temperature between 160° C. and 170° C. When the substrate was exposed to the GMA precursor, the GMA precursor selectively condensed within and over the SAM structure due to a combination of chemical and van der Walls interactions. The precursor condensate layer was subsequently polymerized upon introduction of TBPO, which initiated GMA polymerization to form a pGMA topcoat that was interdigitated with the SAM structure. Careful control of the GMA vapor pressure and exposure time allowed for selective polymer top-coating of the SAM, as well as ultrafine tuning of the SAM top-coat amount.

The polymer topcoat approach was tested with thiol-based SAMs with various tail functional groups (such as hydrocarbons and halogens) and the results were largely identical. This indicates the generality of the approach, regardless of the SAM chemical nature. The polymer topcoat approach described herein and shown in FIGS. 8A-8E is, therefore, expected to work with any molecular surface coating that allows for selective condensation/polymerization during spiCVD.

Figure 9:
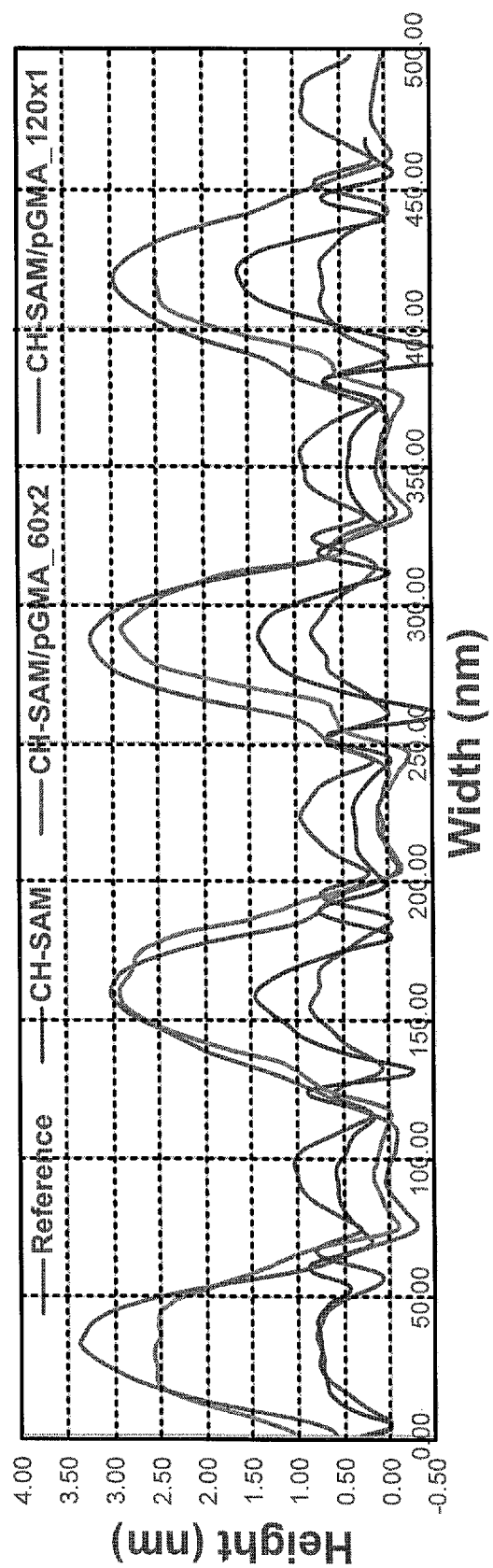
FIG. 9 is an AFM surface line scan illustrating experimental results performed on a patterned substrate containing ILD and SAM-passivated copper lines after: (a) performing chemical mechanical polish (CMP) of the patterned surface, (b) forming a SAM on the copper lines, and (c) using the process shown in FIGS. 8A-8D to stabilize the SAM with a pGMA thin film.

The graph 900 shown in FIG. 9 illustrates experimental results obtained to evaluate the process shown in FIGS. 8A-8E. More specifically, the graph 900 depicts AFM surface line scans of a patterned substrate containing ILD and SAM-passivated copper lines after: (a) performing chemical mechanical polish (CMP) of the patterned surface, (b) forming a CH-type thiol SAM structure on the copper lines, and (c) using the process shown in FIGS. 8A-8D to deposit a pGMA thin film in/on the SAM structure to stabilize the SAM structure. The AFM line-scans shown in FIG. 9 depict the height profiles (expressed in nm) obtained from the patterned substrate after each of the process steps mentioned above. The AFM line-scans prove that a pGMA polymer film can be selectively deposited on the SAM-passivated copper lines without depositing polymer over the ILD lines.

Area-selective, polymer top-coating of a SAM structure requires minimal polymer nucleation on the neighboring dielectric surfaces. Avoiding polymer deposition on the dielectric surfaces is especially important in DoD applications, as any polymer residue could block the DoD process. The area selectivity of the polymer top-coating process presented above benefits from the selective condensation of the polymer precursor in/over the SAM structure versus the dielectric surfaces. In some embodiments, the selectivity window for the polymer top-coating process may be wide enough to coat as much as 3 nm of polymer on the SAM structure without significant contamination of the dielectric surfaces, and thus, may be utilized in DoD applications.

As noted above, the polymer topcoat stabilizes the SAM structure by: (a) healing defects in the SAM structure and providing blanket coverage over the metal layer surface, (b) preventing migration of SAM-forming molecules to neighboring dielectric material surfaces, and (c) increasing the thickness and rigidity of the SAM structure. The stabilized SAM structure was tested for thermal and shelf stability, and was shown to be stable at elevated temperatures up to 250° C. and demonstrated shelf stability as long as four weeks. Though higher temperature and longer shelf life were not evaluated, extended thermal and shelf stability is expected.

In conventional DoD applications, SAM coating of the metal surfaces in a dielectric/metal pattern is intended to enable area selective DoD by inhibiting dielectric growth on the metal surfaces. DoD is typically performed using vapor deposition methods, such as CVD and ALD. In such methods, the SAM structure inhibits dielectric growth on metal surfaces by preventing the precursor from reaching the metal surface. Additionally, the hydrophobic nature of the SAM tails repels water, which is a co-reactant of oxide ALD recipes.

In the present disclosure, the polymer topcoat applied to the SAM improves the precursor inhibition of the SAM structure by forming a denser, more stable structure as well as heals any defect in the SAM structure originally formed on the pattern. A hydrophilic polymer, however, can eventually lead to unwanted ALD nucleation. It is therefore essential to provide a hydrophobic surface in DoD applications. This can be achieved in one of two ways: 1) using a hydrophobic polymer for top-coating, or 2) further modifying the polymer top-coated SAM with a secondary hydrophobic layer, such as another SAM or functional molecules.

The polymer topcoat approach shown in FIGS. 8A-8D and described above provides a variety of advantages over conventional techniques. For example, the polymer topcoat process described above may be used to provide selective SAM stabilization and defect healing with polymers for area-selective DoD. In some embodiments, the process steps shown in FIGS. 8A-8E can be performed in the same deposition chamber or processing tool. This alleviates the need for multi-step SAM application and residue removal, improves yield, lowers process time, and offers versatility.

As noted above, the polymer topcoat applied to the SAM structure enhances the thermal, physical and chemical stability of the SAM structure. This enables SAMs to be used in a variety of applications (such as DoD) where SAM stability and defects typically limit the application. It also enables SAMs to be used in a variety of other applications. When used as spiCVD nucleation enhancer, for example, an "imperfect" SAM can be used to drive selective polymer growth on a SAM-coated surface. A polymer top-coated SAM may also be used as an ALD nucleation mask by masking the underlying substrate from contamination with ALD nuclei and defects.

The polymer topcoat process shown in FIGS. 8A-8D utilizes spiCVD to selectively coat a very small amount of polymer (e.g., a few angstroms) in/on a SAM structure in a cyclic process, which sequentially exposes the surface of the substrate to a monomer precursor to selectively form a thin condensate film on the SAM structure before exposing the surface of the substrate to an initiator, which polymerizes the condensate film and forms a polymer thin film in/on the SAM structure. The amount of polymer selectively formed in/on the SAM structure can be adjusted by repeating the steps of sequentially exposing the surface of the substrate to the monomer precursor and the initiator for one or more spiCVD cycles, and can be fine-tuned by controlling the vapor pressure of the monomer precursor, the precursor exposure time and the number of spiCVD cycles. Other advantages may be apparent to one skilled in the art.

FIGS. 10-13 illustrate exemplary methods that utilize the techniques described herein to selectively deposit polymer thin films on a wide variety of target materials, including dielectric materials, metal and/or metal oxide materials and self-assembled monolayer (SAM) assemblies. It will be recognized that the embodiments of FIGS. 10-13 are merely exemplary and additional methods may utilize the techniques described herein. Further, additional processing steps may be added to the methods shown in the FIGS. 10-13 as the steps described are not intended to be exclusive. Moreover, the order of the steps is not limited to the order shown in the figures as different orders may occur and/or various steps may be performed in combination or at the same time.

Figure 10:
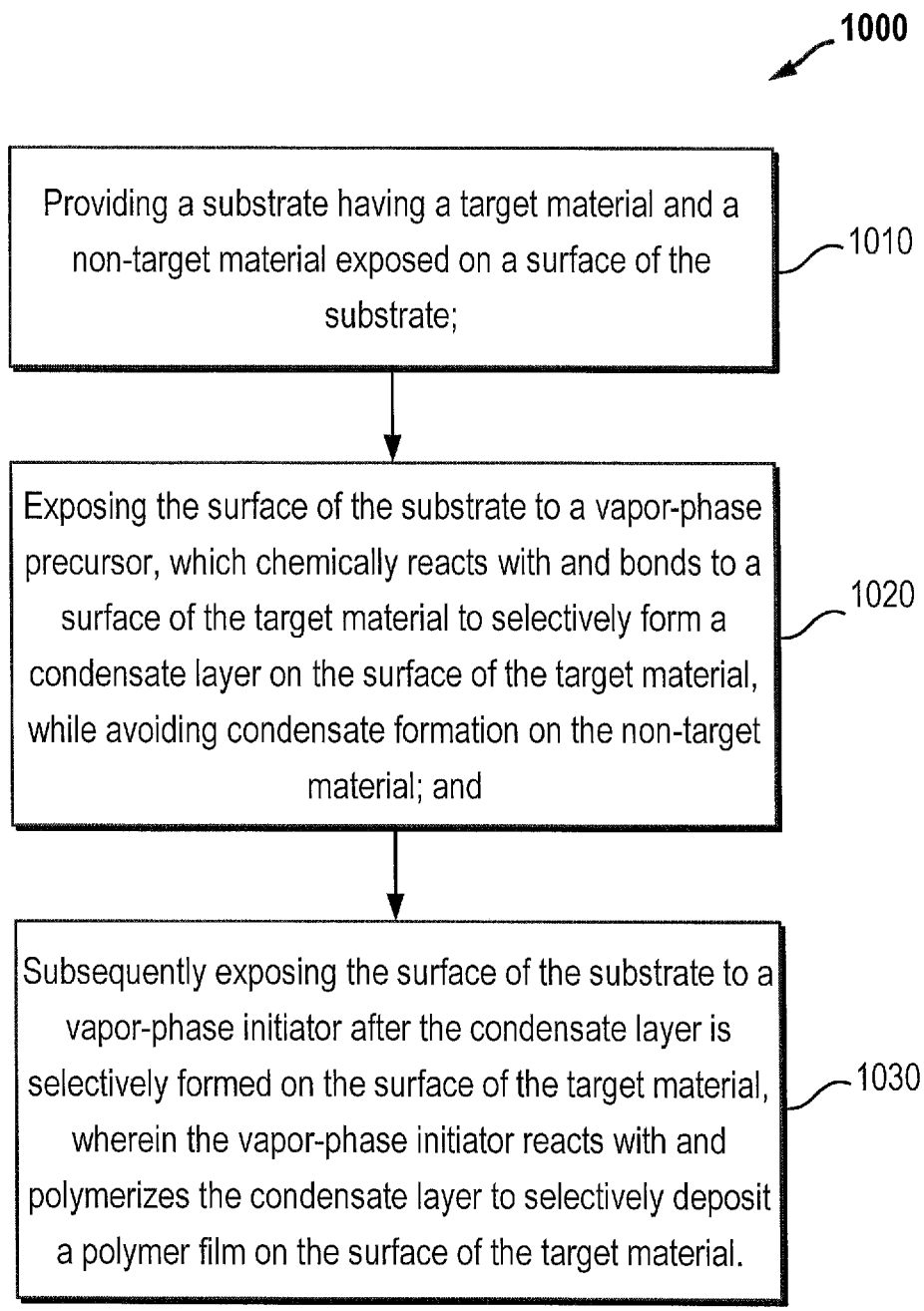
FIG. 10 is a flowchart diagram illustrating one embodiment of a method that may be used for area-selective deposition (ASD) of polymer films in accordance with the present disclosure.

FIG. 10 illustrates one embodiment of a method 1000 that may be used for area-selective deposition (ASD) of polymer films in accordance with the present disclosure. The method 1000 may generally begin by providing a substrate having a target material and a non-target material exposed on a surface of the substrate (in step 1010). Next, the method 1000 may include exposing the surface of the substrate to a vapor-phase precursor, which chemically reacts with and bonds to a surface of the target material to selectively form a condensate layer on the surface of the target material, while avoiding condensate formation on the non-target material (in step 1020), and subsequently exposing the surface of the substrate to a vapor-phase initiator after the condensate layer is selectively formed on the surface of the target material (in step 1030). When the vapor-phase is introduced (in step 1030), the vapor-phase initiator reacts with and polymerizes the condensate layer to selectively deposit a polymer film on the surface of the target material.

The surface of the substrate is initially exposed to the vapor-phase precursor for a precursor exposure time (in step 1020) before the surface of the substrate is subsequently exposed to the vapor-phase initiator (in step 1030). In some embodiments, the method 1000 may further include controlling a thickness of the polymer film by varying at least one of the precursor exposure time and a vapor pressure of the vapor-phase precursor (in step 1020).

In some embodiments, the method 1000 may further include repeating the steps of exposing the surface of the substrate to the vapor-phase precursor (in step 1020) and subsequently exposing the surface of the substrate to the vapor-phase initiator (in step 1030) for a predetermined number of cycles to selectively deposit a predetermined thickness of the polymer film on the surface of the target material without contaminating the non-target material with polymer. In some embodiments, the method 1000 may further include controlling an amount of the polymer film that is selectively deposited on the target material, per cycle, by varying at least one of the precursor exposure time and a vapor pressure of the vapor-phase precursor. In some embodiments, the amount of the polymer film selectively deposited on the target material per cycle may be less than 2 nm, and steps 1020 and 1030 may be repeated a predetermined number of cycles (e.g., 10 to 40 cycles) to selectively deposit up to 20 nm of the polymer film on the surface of the target material without contaminating the non-target material with polymer.

In some embodiments, the additional steps may be performed prior to exposing the surface of the substrate to the vapor-phase precursor (in step 1020). For example, the method 1000 may further include: (a) determining a selectivity window based on polymer growth rates achieved per cycle on the target material and on the non-target material, and (b) selecting, from within the selectivity window, the predetermined number of cycles needed to selectively deposit the predetermined thickness of the polymer film on the surface of the target material without contaminating the non-target material with polymer.

The method 1000 shown in FIG. 10 may be used for area-selective deposition (ASD) of polymer films on target materials, while avoiding contamination of non-target materials formed on the same substrate. Examples of target materials include, but are not limited to, dielectric materials, metal or metal oxide materials and SAM-passivated metal or metal oxides. Non-target materials formed on the same substrate preferably have different wetting properties than the target materials. In some embodiments, the target material may be a dielectric material, and the non-target material may be a metal or metal oxide material. In other embodiments, the target material may be a metal or metal oxide material, and the non-target material may be a dielectric material.

In some embodiments of the method 1000, a polymer film may be selectively deposited on a dielectric material by exposing the surface of the substrate to a monomer precursor (in step 1020) and subsequently exposing the surface of the substrate to the vapor-phase initiator (in step 1030). The monomer precursor chemically reacts with and bonds to a surface of the dielectric material to selectively form a monomer condensate layer on the surface of the dielectric material, while avoiding condensate formation on the metal or metal oxide material. When the vapor-phase initiator is introduced (in step 1030), the vapor-phase initiator reacts with and polymerizes the monomer condensate layer to selectively deposit the polymer film on the surface of the dielectric material.

In some embodiments of the method 1000, a dielectric film may be selectively deposited on a dielectric material by exposing the surface of the substrate to the vapor-phase precursor comprises exposing the surface of the substrate to a dielectric precursor (in step 1020) and subsequently exposing the surface of the substrate to the vapor-phase initiator (in step 1030). The dielectric precursor chemically reacts with and bonds to a surface of the dielectric material to selectively form a dielectric condensate layer on the surface of the dielectric material, while avoiding condensate formation on the metal or metal oxide material. When the vapor-phase initiator is introduced (in step 1030), the vapor-phase initiator reacts with and polymerizes the dielectric condensate layer to selectively deposit a dielectric film on the surface of the dielectric material.

In some embodiments of the method 1000, a polymer film may be selectively deposited on a SAM-passivated metal or metal oxide. Prior to exposing the surface of the substrate to the vapor-phase precursor (in step 1020), the method 1000 may further include forming a self-assembled monolayer (SAM) on a surface of a metal or metal oxide material to modify chemical and/or physical surface properties of the metal or metal oxide material and form a SAM-passivated metal or metal oxide. Once the SAM-passivated metal or metal oxide is formed, the method 1000 may expose the surface of the substrate to a monomer precursor (in step 1020) and subsequently exposing the surface of the substrate to the vapor-phase initiator (in step 1030). The monomer precursor selectively condenses on the SAM to form a monomer condensate layer on the SAM-passivated metal or metal oxide, while avoiding condensate formation on the dielectric material. When the vapor-phase initiator is introduced (in step 1030), the vapor-phase initiator reacts with and polymerizes the monomer condensate layer to selectively deposit the polymer film on the SAM-passivated metal or metal oxide.

Figure 11:
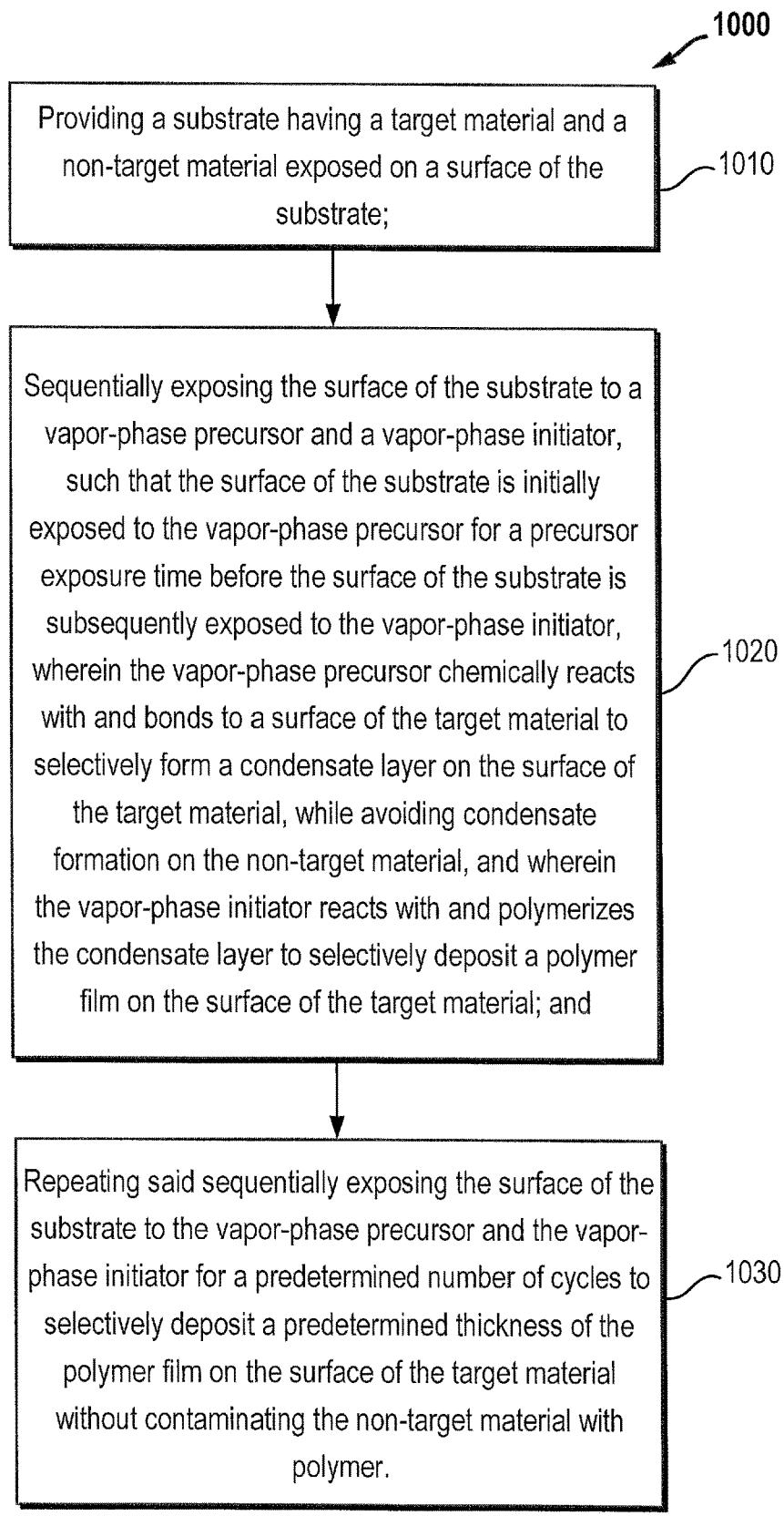
FIG. 11 is a flowchart diagram illustrating another embodiment of a method that may be used for area-selective deposition (ASD) of polymer films in accordance with the present disclosure.

FIG. 11 illustrates another embodiment of a method 1100 that may be used for area-selective deposition (ASD) of polymer films in accordance with the present disclosure. The method 1100 may generally begin by providing a substrate having a target material and a non-target material exposed on a surface of the substrate (in step 1110). Next, the method 1100 may include sequentially exposing the surface of the substrate to a vapor-phase precursor and a vapor-phase initiator, such that the surface of the substrate is initially exposed to the vapor-phase precursor for a precursor exposure time before the surface of the substrate is subsequently exposed to the vapor-phase initiator (in step 1120). When the vapor-phase precursor is initially introduced (in step 1120), the vapor-phase precursor chemically reacts with and bonds to a surface of the target material to selectively form a condensate layer on the surface of the target material, while avoiding condensate formation on the non-target material. When the vapor-phase initiator is subsequently introduced (in step 1120), the vapor-phase initiator reacts with and polymerizes the condensate layer to selectively deposit a polymer film on the surface of the target material. Next, the method 1100 may include repeating the step of sequentially exposing the surface of the substrate to the vapor-phase precursor and the vapor-phase initiator for a predetermined number of cycles to selectively deposit a predetermined thickness of the polymer film on the surface of the target material without contaminating the non-target material with polymer (in step 1130).

In some embodiments, the method 1100 may further include controlling an amount of the polymer film that is selectively deposited on the target material, per cycle, by varying at least one of the precursor exposure time and a vapor pressure of the vapor-phase precursor. In some embodiments, the amount of the polymer film selectively deposited on the target material per cycle may be less than 2 nm, and step 1130 may be repeated a predetermined number of cycles (e.g., 10 to 40 cycles) to selectively deposit up to 20 nm of the polymer film on the surface of the target material without contaminating the non-target material with polymer.

In some embodiments, the additional steps may be performed prior to sequentially exposing the surface of the substrate to the vapor-phase precursor and the vapor-phase initiator (in step 1120). For example, the method 1100 may further include: (a) determining a selectivity window based on polymer growth rates achieved per cycle on the target material and on the non-target material, and (b) selecting, from within the selectivity window, the predetermined number of cycles needed to selectively deposit the predetermined thickness of the polymer film on the surface of the target material without contaminating the non-target material with polymer.

Like the method 1000, the method 1100 shown in FIG. 11 may be used for area-selective deposition (ASD) of polymer films on target materials, while avoiding contamination of non-target materials formed on the same substrate. Examples of target materials include, but are not limited to, dielectric materials, metal or metal oxide materials and SAM-passivated metal or metal oxides. Non-target materials formed on the same substrate preferably have different wetting properties than the target materials. In some embodiments, the target material may be a dielectric material, and the non-target material may be a metal or metal oxide material. In other embodiments, the target material may be a metal or metal oxide material, and the non-target material may be a dielectric material.

In some embodiments of the method 1100, a polymer film may be selectively deposited on a dielectric material. In such embodiments, step 1120 may include: (a) initially exposing the surface of the substrate to a monomer precursor, which chemically reacts with and bonds to a surface of the dielectric material to selectively form a monomer condensate layer on the surface of the dielectric material, while avoiding condensate formation on the metal or metal oxide material, and (b) subsequently exposing the surface of the substrate to the vapor-phase initiator to polymerize the monomer condensate layer and selectively deposit the polymer film on the surface of the dielectric material. In some embodiments, the monomer precursor may be selected from a group of, but not limited to, glycidyl methacrylate (GMA), alkyl acrylates, alkyl cyclosiloxane, perfluoroalkylethylmehacrylate, and trivinyltrimethoxycyclotrisiloxane, and the vapor-phase initiator may be selected from a group of, but not limited to, tert-butylperoxide (TBPO), perfluorooctane sulfonyl fluoride, triethylamine, and organic peroxides. In one example embodiment, the vapor-phase precursor may be glycidyl methacrylate (GMA), and wherein the vapor-phase initiator may be tert-butylperoxide (TBPO).

In some embodiments of the method 1100, a dielectric film may be selectively deposited on a dielectric material. In such embodiments, step 1120 may include: (a) initially exposing the surface of the substrate to a dielectric precursor, which chemically reacts with and bonds to a surface of the dielectric material to selectively form a dielectric condensate layer on the surface of the dielectric material, while avoiding condensate formation on the metal or metal oxide material, and (b) subsequently exposing the surface of the substrate to the vapor-phase initiator to polymerize the dielectric condensate layer and selectively deposit a dielectric film on the surface of the dielectric material. In some embodiments, the dielectric precursor may be a precursor for a low-k dielectric material, and the vapor-phase initiator may be tert-butylperoxide (TBPO), perfluorooctane sulfonyl fluoride, triethylamine, or organic peroxides.

In some embodiments of the method 1100, a polymer film may be selectively deposited on a SAM-passivated metal or metal oxide. Prior to sequentially exposing the surface of the substrate to the vapor-phase precursor and the vapor-phase initiator (in step 1120), the method 1100 may further forming a self-assembled monolayer (SAM) structure on a surface of the metal or metal oxide material to modify chemical and/or physical surface properties of the metal or metal oxide material and form a SAM-passivated metal or metal oxide. Once the SAM-passivated metal or metal oxide is formed, the method 1100 may sequentially expose the surface of the substrate to the vapor-phase precursor and the vapor-phase initiator (in step 1120) by: (a) initially exposing the surface of the substrate to a monomer precursor, which selectively condenses on the SAM structure to form a monomer condensate layer on the SAM-passivated metal or metal oxide, while avoiding condensate formation on the dielectric material, and (b) subsequently exposing the surface of the substrate to the vapor-phase initiator to polymerize the monomer condensate layer and selectively deposit the polymer film on the SAM-passivated metal or metal oxide.

Figure 12:
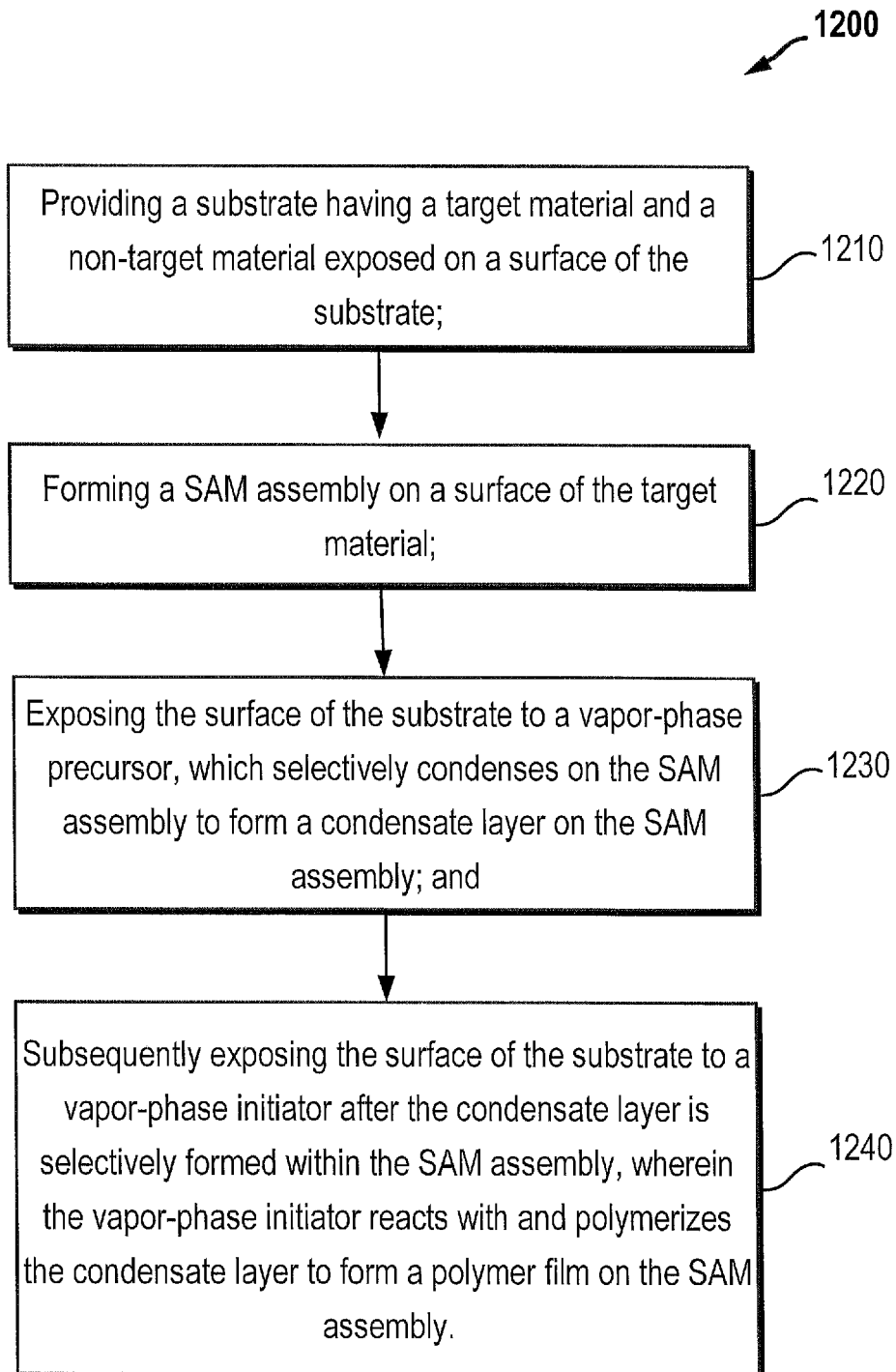
FIG. 12 is a flowchart diagram illustrating one embodiment of a method that may be used to stabilize a SAM structure in accordance with the present disclosure.

FIG. 12 illustrates one embodiment of a method 1200 that may be used to stabilize a self-assembled monolayer (SAM) structure in accordance with the present disclosure. The method 1200 may generally begin by providing a substrate having a target material and a non-target material exposed on a surface of the substrate (in step 1210) and forming a SAM structure on a surface of the target material (in step 1220), Next, the method 1200 may include exposing the surface of the substrate to a vapor-phase precursor, which selectively condenses on the SAM structure to form a condensate layer on the SAM structure (in step 1230), and subsequently exposing the surface of the substrate to a vapor-phase initiator after the condensate layer is selectively formed on the SAM structure (in step 1240). When the vapor-phase initiator is introduced (in step 1240), the vapor-phase initiator reacts with and polymerizes the condensate layer to form a polymer film on the SAM structure. When the method 1200 is used, the polymer film stabilizes the SAM structure by: (a) healing defects in the SAM structure and providing blanket coverage over the target material, (b) preventing migration of SAM-forming molecules to neighboring non-target material surfaces, and (c) increasing a thickness and rigidity of the SAM structure.

In some embodiments, the step 1230 of exposing the surface of the substrate to the vapor-phase precursor and the step 1240 of subsequently exposing the surface of the substrate to a vapor-phase initiator are performed using a sequentially pulsed initiated chemical vapor deposition (spiCVD) process. In such a process, the surface of the substrate is initially exposed to the vapor-phase precursor for a precursor exposure time before the surface of the substrate is subsequently exposed to the vapor-phase initiator.

In some embodiments, the substrate may be provided within a processing tool (in step 1210), and the steps of forming the SAM structure (in step 1220), exposing the surface of the substrate to the vapor-phase precursor (in step 1230) and subsequently exposing the surface of the substrate to a vapor-phase initiator (in step 1240) may each be performed within the same processing tool.

In some embodiments, the method 1200 may further include repeating the steps of exposing the surface of the substrate to the vapor-phase precursor (in step 1230) and subsequently exposing the surface of the substrate to the vapor-phase initiator (in step 1240) for a predetermined number of cycles to selectively deposit a predetermined thickness of the polymer film on the SAM structure without contaminating the non-target material with polymer.

In some embodiments, the method 1200 may further include controlling an amount of the polymer film that is selectively deposited on the SAM structure, per cycle, by varying at least one of the precursor exposure time and a vapor pressure of the vapor-phase precursor. In some embodiments, the amount of the polymer film selectively deposited on the SAM structure per cycle may be less than 2 nm, and steps 1230 and 1240 may be repeated a predetermined number of cycles (e.g., 1 to 6 cycles) to selectively deposit up to 3 nm of the polymer film within and on top of the SAM structure without contaminating the non-target material with polymer.

In some embodiments, the additional steps may be performed prior to exposing the surface of the substrate to the vapor-phase precursor (in step 1230). For example, the method 1200 may further include: (a) determining a selectivity window based on polymer growth rates achieved per cycle on the SAM structure and on the non-target material, and (b) selecting, from within the selectivity window, the predetermined number of cycles needed to selectively deposit the predetermined thickness of the polymer film on the SAM structure without contaminating the non-target material with polymer.

The method 1200 shown in FIG. 12 may utilize a wide variety of vapor-phase precursors and vapor-phase initiators to form the polymer film. In some embodiments, for example, the vapor-phase precursor may be a monomer precursor selected from a group of, but not limited to, glycidyl methacrylate (GMA), alkyl acrylates, alkyl cyclosiloxane, trivinyltrimethoxycyclotrisiloxane, and perfluoroalkylethylmehacrylate, and the vapor-phase initiator may be selected from a group of, but not limited to, tert-butylperoxide (TBPO), perfluorooctane sulfonyl fluoride, triethylamine, and organic peroxides. In one example embodiment, the vapor-phase precursor may be glycidyl methacrylate (GMA), and wherein the vapor-phase initiator may be tert-butylperoxide (TBPO).

The method 1200 shown in FIG. 12 may be utilized to stabilize SAM assemblies formed on a wide variety of materials. In some embodiments, for example, the step 1220 of forming the SAM structure on the surface of the target material (may include forming the SAM structure on a metal material, a hard mask material or a photoresist material.

Figure 13:
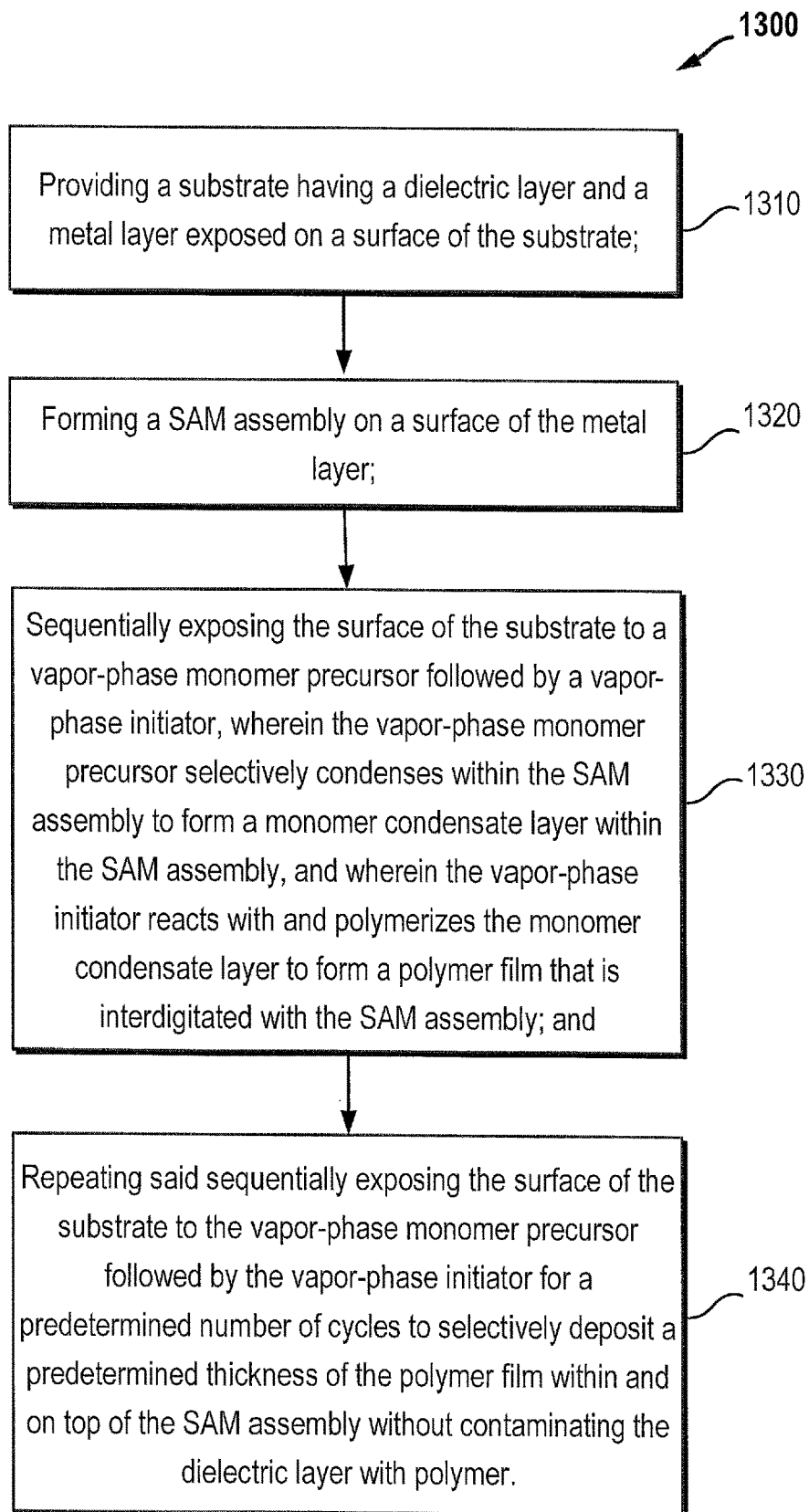
FIG. 13 is a flowchart diagram illustrating one embodiment of a method that may be used to stabilize a SAM structure utilized in a dielectric-on-dielectric process in accordance with the present disclosure.

FIG. 13 illustrates one embodiment of a method 1300 that may be used to stabilize a self-assembled monolayer (SAM) structure utilized in a dielectric-on-dielectric (DoD) process in accordance with the present disclosure. The method 1300 may generally begin by providing a substrate having a dielectric layer and a metal layer exposed on a surface of the substrate (in step 1310) and forming a SAM structure on a surface of the metal layer (in step 1320). Next, the method 1300 may include sequentially exposing the surface of the substrate to a vapor-phase monomer precursor followed by a vapor-phase initiator (in step 1330). When the vapor-phase monomer precursor is introduced (in step 1330), the vapor-phase monomer precursor selectively condenses within the SAM structure to form a monomer condensate layer within the SAM structure. When the vapor-phase initiator is subsequently introduced (in step 1330), the vapor-phase initiator reacts with and polymerizes the monomer condensate layer to form a polymer film that is interdigitated with the SAM structure. Next, the method 1300 may include repeating the step of sequentially exposing the surface of the substrate to the vapor-phase monomer precursor followed by the vapor-phase initiator for a predetermined number of cycles to selectively deposit a predetermined thickness of the polymer film within and on top of the SAM structure without contaminating the dielectric layer with polymer (in step 1340).

In some embodiments, the step 1330 of sequentially exposing the surface of the substrate to the vapor-phase monomer precursor followed by the vapor-phase initiator may be performed using a sequentially pulsed initiated chemical vapor deposition (spiCVD) process. In such a process, the surface of the substrate is initially exposed to the vapor-phase monomer precursor for a precursor exposure time before the surface of the substrate is subsequently exposed to the vapor-phase initiator (in step 1330).

In some embodiments, the method 1300 may further include controlling an amount of the polymer film that is selectively deposited on the SAM structure, per cycle, by varying at least one of the precursor exposure time and a vapor pressure of the vapor-phase precursor. In some embodiments, the amount of the polymer film selectively deposited on the SAM structure per cycle may be less than 2 nm, and the step 1330 of sequentially exposing the surface of the substrate to the vapor-phase precursor followed by the vapor-phase initiator may be repeated (in step 1340) a predetermined number of cycles (e.g., 10 to 40 cycles) to selectively deposit up to 20 nm of the polymer film within and on top of the SAM structure without contaminating the non-target material with polymer.

In some embodiments, the additional steps may be performed prior to sequentially exposing the surface of the substrate to the vapor-phase monomer precursor followed by the vapor-phase initiator (in step 1330). For example, the method 1300 may further include: (a) determining a selectivity window based on polymer growth rates achieved per cycle on the SAM structure and on the dielectric layer, and (b) selecting, from within the selectivity window, the predetermined number of cycles needed to selectively deposit the predetermined thickness of the polymer film within and on top of the SAM structure without contaminating the dielectric layer with polymer.

As noted above, the method 1300 shown in FIG. 13 may be used to stabilize a SAM structure utilized in a dielectric-on-dielectric (DoD) process. As such, additional step(s) may be performed after the predetermined thickness of the polymer film is selectively deposited within and on top of the SAM structure (in step 1340). For example, the method 1300 may further include depositing a dielectric material on a surface of the dielectric layer. In some embodiments, the dielectric material may be deposited by exposing the surface of the substrate to a dielectric precursor, which reacts with and bonds to the surface of the dielectric layer to deposit the dielectric material on the surface of the dielectric layer. In some embodiments, the polymer film formed within and on top of the SAM structure (in step 1340) may stabilize the SAM structure by: (a) healing defects in the SAM structure and providing blanket coverage over the metal layer, (b) preventing migration of SAM-forming molecules to the dielectric material deposited on the surface of the dielectric layer, and (c) increasing a thickness and rigidity of the SAM structure to direct vertical growth of the dielectric material and prevent mushrooming of the dielectric material over the metal layer.

In some embodiments, the method 1300 shown in FIG. 13 may be used to implement a DoD process within a single chamber or processing tool. For example, the substrate may be provided within a processing tool (in step 1310), and the steps of forming the SAM structure (in step 1320), sequentially exposing the surface of the substrate to the vapor-phase monomer precursor followed by the vapor-phase initiator (in step 1330) and depositing the dielectric material on the surface of the dielectric layer (in step 1340) may each be performed within the same processing tool.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for area-selective deposition (ASD) of polymer films, the method comprising:
   providing a substrate having a target material and a non-target material exposed on a surface of the substrate;
   utilizing a sequentially pulsed initiated chemical vapor deposition (spiCVD) process to selectively deposit a polymer film on a surface of the target material, wherein said utilizing the spiCVD process includes:
   exposing the surface of the substrate to a vapor-phase precursor, which chemically reacts with and bonds to the surface of the target material to selectively form a condensate layer on the surface of the target material, while avoiding condensate formation on the non-target material; and
   subsequently exposing the surface of the substrate to a vapor-phase initiator after the condensate layer is selectively formed on the surface of the target material, wherein the vapor-phase initiator reacts with and polymerizes the condensate layer to selectively deposit the polymer film on the surface of the target material.

2. The method of claim 1, wherein the surface of the substrate is initially exposed to the vapor-phase precursor for a precursor exposure time before the surface of the substrate is subsequently exposed to the vapor-phase initiator.

3. The method of claim 2, further comprising controlling a thickness of the polymer film by varying at least one of the precursor exposure time and a vapor pressure of the vapor-phase precursor.

4. The method of claim 2, further comprising repeating said exposing the surface of the substrate to the vapor-phase precursor and said subsequently exposing the surface of the substrate to the vapor-phase initiator for a predetermined number of cycles to selectively deposit a predetermined thickness of the polymer film on the surface of the target material without contaminating the non-target material with polymer.

5. The method of claim 4, further comprising controlling an amount of the polymer film that is selectively deposited on the target material, per cycle, by varying at least one of the precursor exposure time and a vapor pressure of the vapor-phase precursor.

6. The method of claim 4, wherein prior to exposing the surface of the substrate to the vapor-phase precursor, the method further comprises:
   determining a selectivity window based on polymer growth rates achieved per cycle on the target material and on the non-target material; and
   selecting, from within the selectivity window, the predetermined number of cycles needed to selectively deposit the predetermined thickness of the polymer film on the surface of the target material without contaminating the non-target material with polymer.

7. The method of claim 1, wherein the target material is a dielectric material, and wherein the non-target material is a metal or metal oxide material.

8. The method of claim 7, wherein said exposing the surface of the substrate to the vapor-phase precursor comprises exposing the surface of the substrate to a monomer precursor, which chemically reacts with and bonds to a surface of the dielectric material to selectively form a monomer condensate layer on the surface of the dielectric material, while avoiding condensate formation on the metal or metal oxide material, and wherein said subsequently exposing the surface of the substrate to the vapor-phase initiator polymerizes the monomer condensate layer to selectively deposit the polymer film on the surface of the dielectric material.

9. The method of claim 7, wherein said exposing the surface of the substrate to the vapor-phase precursor comprises exposing the surface of the substrate to a dielectric precursor, which chemically reacts with and bonds to a surface of the dielectric material to selectively form a condensate layer on the surface of the dielectric material, while avoiding condensate formation on the metal or metal oxide material, and wherein said subsequently exposing the surface of the substrate to the vapor-phase initiator polymerizes the condensate layer to selectively deposit a dielectric film on the surface of the dielectric material.

10. The method of claim 1, wherein the target material is a metal or metal oxide material, and wherein the non-target material is a dielectric material.

11. The method of claim 10, wherein prior to exposing the surface of the substrate to the vapor-phase precursor, the method further comprises forming a self-assembled monolayer (SAM) on a surface of the metal or metal oxide material to form a SAM-passivated metal or metal oxide.

12. The method of claim 11, wherein said exposing the surface of the substrate to the vapor-phase precursor comprises exposing the surface of the substrate to a monomer precursor, which selectively condenses on the SAM to form a monomer condensate layer on the SAM-passivated metal or metal oxide, while avoiding condensate formation on the dielectric material, and wherein said subsequently exposing the surface of the substrate to the vapor-phase initiator polymerizes the monomer condensate layer to selectively deposit the polymer film on the SAM-passivated metal or metal oxide.

13. A method for area-selective deposition (ASD) of polymer films, the method comprising:
   providing a substrate having a target material and a non-target material exposed on a surface of the substrate;
   utilizing a sequentially pulsed initiated chemical vapor deposition (spiCVD) process to selectively deposit a predetermined thickness of a polymer film on a surface of the target material without contaminating the non-target material with polymer, wherein said utilizing the spiCVD process includes:
   sequentially exposing the surface of the substrate to a vapor-phase precursor and a vapor-phase initiator, such that the surface of the substrate is initially exposed to the vapor-phase precursor for a precursor exposure time before the surface of the substrate is subsequently exposed to the vapor-phase initiator, wherein the vapor-phase precursor chemically reacts with and bonds to the surface of the target material to selectively form a condensate layer on the surface of the target material, while avoiding condensate formation on the non-target material, and wherein the vapor-phase initiator reacts with and polymerizes the condensate layer to selectively deposit the polymer film on the surface of the target material; and
   repeating said sequentially exposing the surface of the substrate to the vapor-phase precursor and the vapor-phase initiator for a predetermined number of cycles to selectively deposit the predetermined thickness of the polymer film on the surface of the target material without contaminating the non-target material with polymer.

14. The method of claim 13, further comprising controlling an amount of the polymer film that is selectively deposited on the target material, per cycle, by varying at least one of the precursor exposure time and a vapor pressure of the vapor-phase precursor.

15. The method of claim 14, wherein the amount of the polymer film selectively deposited on the target material per cycle is less than 2 nm.

16. The method of claim 13, wherein prior to exposing the surface of the substrate to the vapor-phase precursor, the method further comprises:
   determining a selectivity window based on polymer growth rates achieved per cycle on the target material and on the non-target material; and
   selecting, from within the selectivity window, the predetermined number of cycles needed to selectively deposit the predetermined thickness of the polymer film on the surface of the target material without contaminating the non-target material with polymer.

17. The method of claim 13, wherein the target material is a dielectric material, and wherein the non-target material is a metal or metal oxide material.

18. The method of claim 17, wherein said sequentially exposing the surface of the substrate to the vapor-phase precursor and the vapor-phase initiator comprises:
   initially exposing the surface of the substrate to a monomer precursor, which chemically reacts with and bonds to a surface of the dielectric material to selectively form a monomer condensate layer on the surface of the dielectric material, while avoiding condensate formation on the metal or metal oxide material; and
   subsequently exposing the surface of the substrate to the vapor-phase initiator to polymerize the monomer condensate layer and selectively deposit the polymer film on the surface of the dielectric material.

19. The method of claim 17, wherein said sequentially exposing the surface of the substrate to the vapor-phase precursor and the vapor-phase initiator comprises:
   initially exposing the surface of the substrate to a dielectric precursor, which chemically reacts with and bonds to a surface of the dielectric material to selectively form a condensate layer on the surface of the dielectric material, while avoiding condensate formation on the metal or metal oxide material; and
   subsequently exposing the surface of the substrate to the vapor-phase initiator to polymerize the condensate layer and selectively deposit a dielectric film on the surface of the dielectric material.

20. The method of claim 19, where the dielectric film is a low-k dielectric film.

21. The method of claim 13, wherein the target material is a metal or metal oxide material, and wherein the non-target material is a dielectric material.

22. The method of claim 21, wherein prior to sequentially exposing the surface of the substrate to the vapor-phase precursor and the vapor-phase initiator, the method further comprises forming a self-assembled monolayer (SAM) assembly on a surface of the metal or metal oxide material to modify chemical and/or physical surface properties of the metal or metal oxide material and form a SAM-passivated metal or metal oxide.

23. The method of claim 22, wherein said sequentially exposing the surface of the substrate to the vapor-phase precursor and the vapor-phase initiator comprises:
   initially exposing the surface of the substrate to a monomer precursor, which selectively condenses on the SAM assembly to form a monomer condensate layer on the SAM-passivated metal or metal oxide, while avoiding condensate formation on the dielectric material; and
   subsequently exposing the surface of the substrate to the vapor-phase initiator to polymerize the monomer condensate layer and selectively deposit the polymer film on the SAM-passivated metal or metal oxide.

* * * * *